United States Patent
Kushner et al.

(10) Patent No.: US 11,552,168 B2
(45) Date of Patent: *Jan. 10, 2023

(54) TILED LATERAL BJT

(71) Applicant: Silanna Asia Pte Ltd, Singapore (SG)

(72) Inventors: Vadim Kushner, Solana Beach, CA (US); Nima Beikae, Laguna Niguel, CA (US)

(73) Assignee: Silanna Asia Pte Ltd, Singapore (SG)

(*) Notice: Subject to any disclaimer, the term of this patent is extended or adjusted under 35 U.S.C. 154(b) by 98 days.

This patent is subject to a terminal disclaimer.

(21) Appl. No.: 17/072,777

(22) Filed: Oct. 16, 2020

(65) Prior Publication Data
US 2021/0043729 A1 Feb. 11, 2021

Related U.S. Application Data

(63) Continuation of application No. 15/955,040, filed on Apr. 17, 2018, now Pat. No. 10,811,497.

(51) Int. Cl.
*H01L 29/06* (2006.01)
*H01L 29/735* (2006.01)
(Continued)

(52) U.S. Cl.
CPC ...... *H01L 29/0696* (2013.01); *H01L 29/0808* (2013.01); *H01L 29/0821* (2013.01);
(Continued)

(58) Field of Classification Search
CPC ............ H01L 29/0696; H01L 29/0692; H01L 29/735; H01L 29/0808–0821; H01L 29/1008; H01L 29/41708; H01L 29/6625
See application file for complete search history.

(56) References Cited

U.S. PATENT DOCUMENTS 5,068,702 A 11/1991 Giannella
5,508,552 A 4/1996 Iranmanesh et al.
(Continued)

FOREIGN PATENT DOCUMENTS

CN 102412272 A 4/2012
JP 2010010389 A 1/2010
(Continued)

OTHER PUBLICATIONS

Cheung et al., Design Automation Tools for Tile-Based Analogue Cells, IEE Colloquium on New Directions in VLSI Design, Nov. 27, 1989.
(Continued)

*Primary Examiner* — Bac H Au
(74) *Attorney, Agent, or Firm* — MLO, a professional corp.

(57) ABSTRACT

A lateral transistor tile is formed with first and second collector regions that longitudinally span first and second sides of the transistor tile; and a base region and an emitter region that are between the first and second collector regions and are both centered on a longitudinal midline of the transistor tile. A base-collector current, a collector-emitter current, and a base-emitter current flow horizontally; and the direction of the base-emitter current is perpendicular to the direction of the base-collector current and the collector-emitter current. Lateral BJT transistors having a variety of layouts are formed from a plurality of the tiles and share common components thereof.

20 Claims, 23 Drawing Sheets

(51) Int. Cl.
*H01L 29/08* (2006.01)
*H01L 29/10* (2006.01)
*H01L 29/66* (2006.01)
*H01L 29/40* (2006.01)

(52) U.S. Cl.
CPC ...... *H01L 29/1008* (2013.01); *H01L 29/6625* (2013.01); *H01L 29/735* (2013.01); *H01L 29/408* (2013.01)

(56) References Cited

U.S. PATENT DOCUMENTS

| | | |
|---|---|---|
| 5,852,315 A | 12/1998 | Ker et al. |
| 6,603,173 B1 | 8/2003 | Okabe et al. |
| 6,737,722 B2 | 5/2004 | Yamamoto et al. |
| 7,064,393 B2 | 6/2006 | Mergens et al. |
| 7,897,995 B2 | 3/2011 | Yang et al. |
| 7,932,581 B2 | 4/2011 | Yang et al. |
| 8,115,280 B2 | 2/2012 | Chen et al. |
| 8,415,745 B2 | 4/2013 | Chao |
| 8,525,300 B2 | 9/2013 | Kuo et al. |
| 8,981,521 B1 | 3/2015 | Wang et al. |
| 9,123,558 B2 | 9/2015 | Fan et al. |
| 9,299,817 B2 | 3/2016 | Yoo et al. |
| 9,324,705 B2 | 4/2016 | Ko et al. |
| 9,536,788 B1 | 1/2017 | Ning et al. |
| 9,640,527 B2 | 5/2017 | Lin et al. |
| 9,780,089 B2 | 10/2017 | Tsai et al. |
| 9,831,233 B2 | 11/2017 | Salcedo et al. |
| 9,997,510 B2 | 6/2018 | Tu et al. |
| 10,224,402 B2 | 3/2019 | Lavrovskaya et al. |
| 10,811,497 B2 * | 10/2020 | Kushner ............ H01L 29/0808 |
| 2003/0052387 A1 | 3/2003 | Boeck et al. |
| 2004/0164356 A1 | 8/2004 | Mergens et al. |
| 2006/0011939 A1 | 1/2006 | Mohn et al. |
| 2007/0105301 A1 | 5/2007 | Chen et al. |
| 2008/0157195 A1 | 7/2008 | Sutardja et al. |
| 2010/0038677 A1 | 2/2010 | Chiang et al. |
| 2010/0301453 A1 | 12/2010 | Chung et al. |
| 2011/0163378 A1 | 7/2011 | Tang et al. |
| 2013/0119433 A1 | 5/2013 | Wang |
| 2013/0228824 A1 | 9/2013 | Morishita |
| 2014/0239451 A1 | 8/2014 | Ito et al. |
| 2016/0056146 A1 | 2/2016 | Li et al. |
| 2017/0309703 A1 | 10/2017 | Babcock et al. |
| 2017/0317197 A1 | 11/2017 | Tseng |
| 2018/0012961 A1 | 1/2018 | Aharoni |

FOREIGN PATENT DOCUMENTS

| | | |
|---|---|---|
| KR | 1020160055381 A | 5/2016 |
| TW | 257883 B | 9/1995 |
| TW | 201513338 A | 4/2015 |
| WO | 2013131908 A1 | 9/2013 |

OTHER PUBLICATIONS

Dansky, Bipolar Circuit Design for a 5000-Circuit VLSI Gate Array, IBM J. Res. Develop., vol. 25, No. 3, pp. 116-125, Mar. 1981.
International Search Report dated Aug. 5, 2019 for PCT Patent Application No. PCT/IB2019/052574.
Koike et al., Low-Power Design Methodology for Gbit/s Bipolar LSIs, Proceedings of the 1995 Bipolar/BiCMOS Circuits and Technology Meeting, Oct. 2-3, 1995.
Notice of Allowance dated Jul. 1, 2020 for U.S. Appl. No. 15/955,040.
Notice of Allowance dated Mar. 5, 2020 for U.S. Appl. No. 15/993,384.
Office Action dated Mar. 31, 2020 for U.S. Appl. No. 15/955,040.
Office Action dated Sep. 19, 2019 for U.S. Appl. No. 15/993,384.
Sparkes, Recent Developments and Trends in Bipolar Analog Arrays, Proceedings of the IEEE, vol. 75, No. 6, Jun. 1987.
Office Action dated Sep. 1, 2021 for U.S. Appl. No. 16/894,259.
Official Letter and Search Report dated Oct. 11, 2022 for Taiwan Patent Application No. 108110333.

* cited by examiner

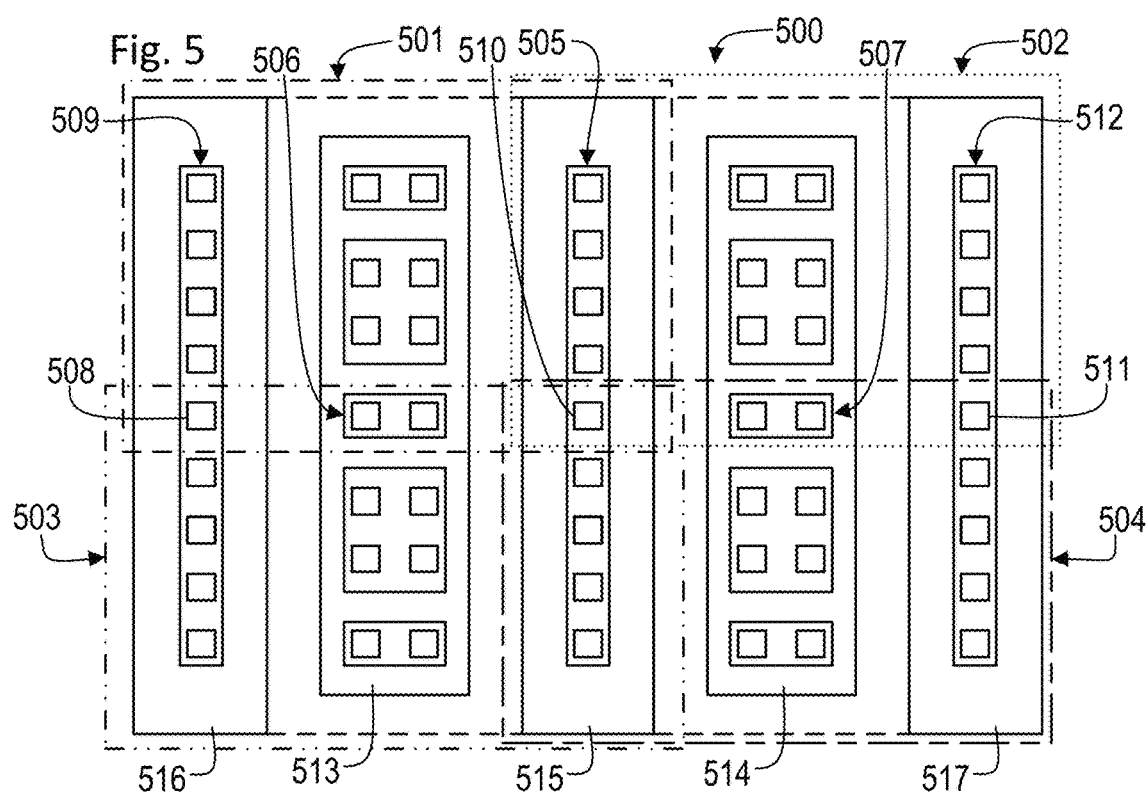
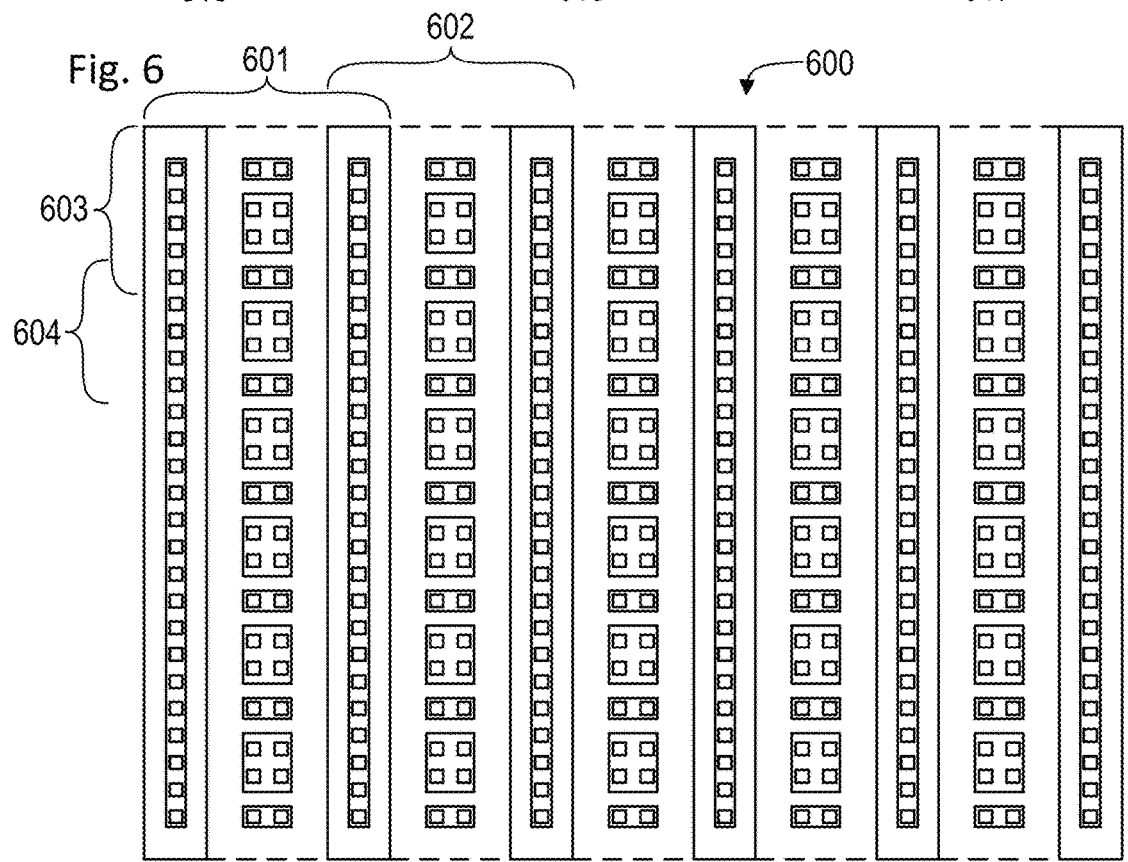

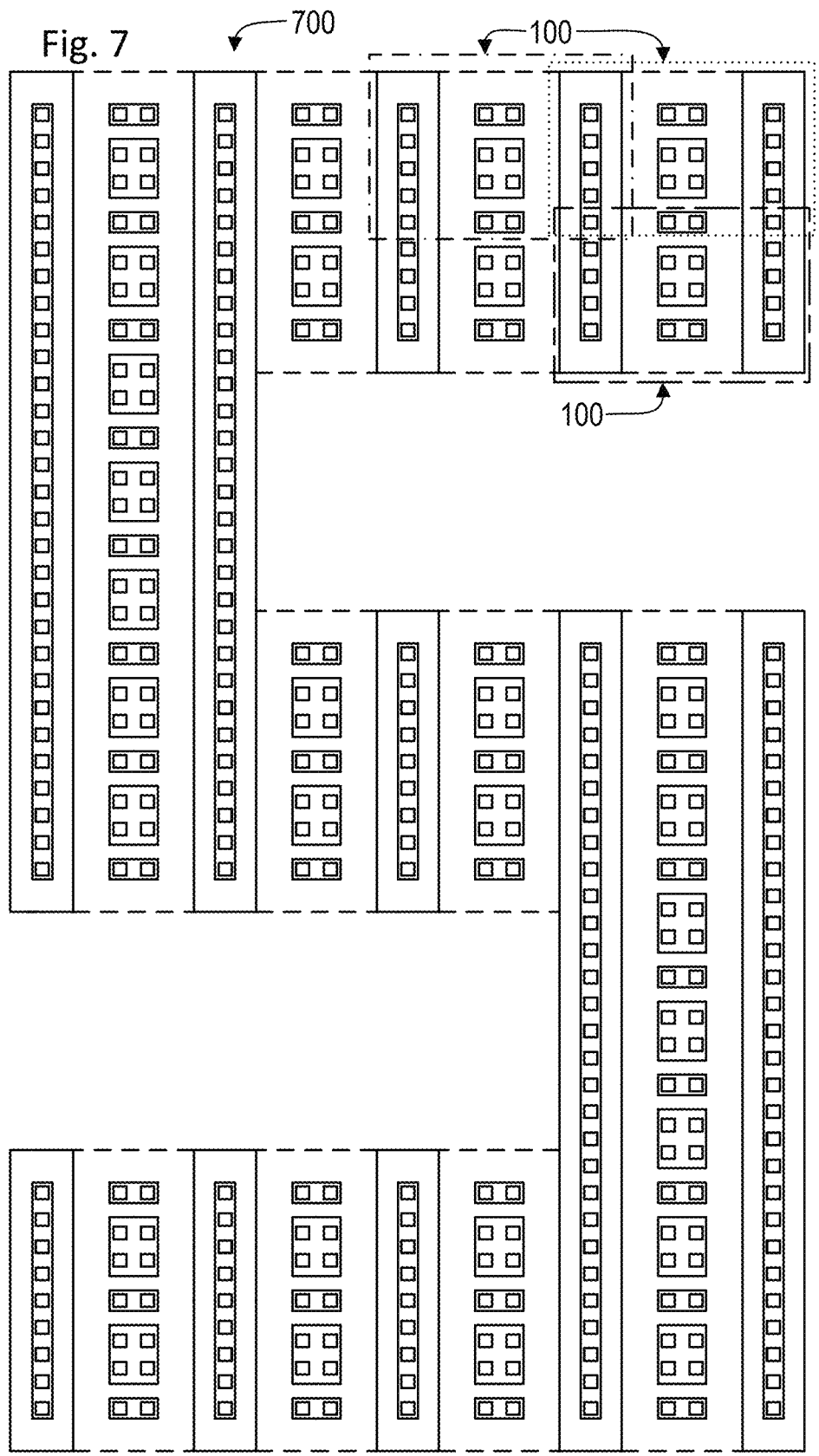

Horizontal NPN Pwell Base
0.6um LDD extension & 1.1um Collector
to Base distance Vb= 0 to 1.3V ; Vc= 1.5V ; Ve= 0V Left Scale: ----- Ib  ----- Ic Right Scale: ——— Beta Vb= 0 to 1.3V ; Vc= 6V ; Ve= 0V Vertical NPN Pwell Base
0.1um LDD enclosure of Active & 0.5um
NBody to NLDD distance
$V_b$= 0 to 1.3V ; $V_c$= 1.5V ; $V_e$= 0V Left Scale: ----- Ib ----- Ic Right Scale: ——— Beta $V_b$= 0 to 1.3V ; $V_c$= 6V* ; $V_e$= 0V

| Device | Maximum Beta with Vc= 1.5V | Vb (V) @ Maximum Beta with Vc= 1.5V |
|---|---|---|
| HNPN_PwellBase_6x6_0p3_0p6 | Leaky | Leaky |
| HNPN_PwellBase_6x6_0p4_0p7 | 177 | 0.7 |
| HNPN_PwellBase_6x6_0p5_0p8 | 134 | 0.7 |
| HNPN_PwellBase_6x6_0p6_0p9 | 101 | 0.7 |
| HNPN_PwellBase_6x6_0p6_1p0 | 91 | 0.7 |
| HNPN_PwellBase_6x6_0p6_1p1 | 84 | 0.7 |
| VNPN_NbodyBAse_50um_0p1_0p5_0p9 | 109 | 0.7 |

2602

| Device | Maximum Beta with Vc=-1.5V | Vb (V) @ Maximum Beta with Vc=-1.5V |
|---|---|---|
| HPNP_NwellBase_6x6_0p3_0p6 | 36 | -0.75 |
| HPNP_NwellBase_6x6_0p4_0p7 | 24 | -0.8 |
| HPNP_NwellBase_6x6_0p5_0p8 | 18.5 | -0.8 |
| HPNP_NwellBase_6x6_0p6_0p9 | 15.9 | -0.8 |
| HPNP_NwellBase_6x6_0p6_1p0 | 13.8 | -0.75 |
| HPNP_NwellBase_6x6_0p6_1p1 | 12.7 | -0.75 |

Fig. 27

| Device | Maximum Beta with Vc= 6V | Vb (V) @ Maximum Beta with Vc= 6V |
|---|---|---|
| HNPN_PwellBase_6x6_0p5_0p8 | leaky | leaky |
| HNPN_PwellBase_6x6_0p6_0p9 | 203 | 0.7 |
| HNPN_PwellBase_6x6_0p6_1p0 | 173 | 0.7 |
| HNPN_PwellBase_6x6_0p6_1p1 | 155 | 0.7 |
| VNPN_NbodyBAse_50um_0p1_0p5_0p9 | 454* | 0.75 |

| Device | Vceo (V) @ 1nA | Vceo (V) @ 1uA |
|---|---|---|
| HNPN_PwellBase_6x6_0p3_0p6 | 1.2 | 3 |
| HNPN_PwellBase_6x6_0p4_0p7 | 2.8 | 5.4 |
| HNPN_PwellBase_6x6_0p5_0p8 | 5.1 | 8 |
| HNPN_PwellBase_6x6_0p6_0p9 | 7.9 | 10.2 |
| HNPN_PwellBase_6x6_0p6_1p0 | 9.6 | 11 |
| HNPN_PwellBase_6x6_0p6_1p1 | 11.2 | 11.8 |
| VNPN_NbodyBAse_50um_0p1_0p5_0p9 | 6.9 | 6.9 |

| Device | Vceo (V) @ 1nA | Vceo (V) @ 1uA |
|---|---|---|
| HPNP_NwellBase_6x6_0p3_0p6 | 2.7 | 3.5 |
| HPNP_NwellBase_6x6_0p4_0p7 | 3.4 | 4.5 |
| HPNP_NwellBase_6x6_0p5_0p8 | 3.7 | 4.7 |
| HPNP_NwellBase_6x6_0p6_0p9 | 3.9 | 4.9 |
| HPNP_NwellBase_6x6_0p6_1p0 | 4 | 5.1 |
| HPNP_NwellBase_6x6_0p6_1p1 | 4.2 | 5.3 |

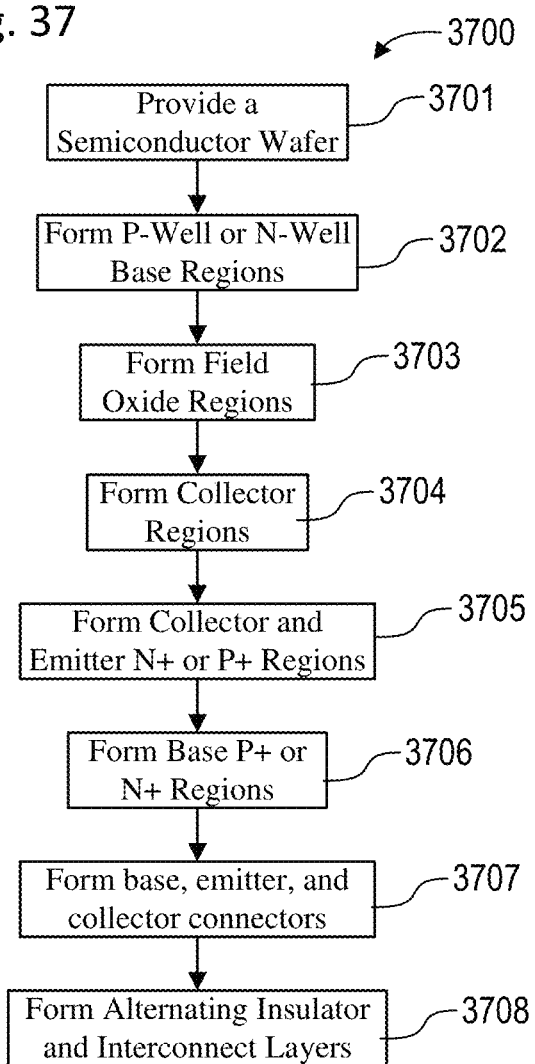

TILED LATERAL BJT

CROSS-REFERENCE TO RELATED APPLICATION

This application is a continuation of U.S. Non-Provisional application Ser. No. 15/955,040, filed Apr. 17, 2018, which is incorporated by reference herein in its entirety.

BACKGROUND

There is an advantage to having a general design for an electronic component, such as a bipolar junction transistor (BJT), that allows for the same general design to be adapted for use in a wide variety of design applications.

Some problems, however, are that some of the design parameters for typical BJT designs are not readily modifiable or scalable. Thus, there is typically little design control over some of the structural features, operating parameters, or performance characteristics of the BJT, such as the geometry of the subcomponents of the BJT or the collector-emitter maximum rating voltage (i.e., maximum voltage the transistor can withstand on its collector measured relative to its emitter with the base open circuit), among other design considerations.

Additionally, spatial constraints within an overall integrated circuit layout can severely restrict a design choice for placement and layout of the BJT device, thereby potentially adversely affecting desired performance characteristics thereof.

Furthermore, given the prevalence of semiconductor-on-insulator (SOI) technologies, it would be advantageous to be able to form the BJT device on an SOI wafer or substrate, yet it is generally difficult to make a functional BJT on an SOI platform.

SUMMARY

In accordance with some embodiments, an improved transistor tile includes a first collector region, a second collector region, a base region, and an emitter region. The first collector region is located within a first portion of the transistor tile. The second collector region is located within a second portion of the transistor tile. The base region is located within a central portion of the transistor tile. The central portion is horizontally between the first and second portions. A direction of a flow of a base-collector current is horizontal between the first and second collector regions and the base region. The emitter region is located within the central portion of the transistor tile. A direction of a flow of a collector-emitter current is horizontal between the first and second collector regions and the emitter region. A direction of a flow of a base-emitter current is horizontal through the base region. The direction of the flow of the base-emitter current is perpendicular to the direction of the flows of the base-collector current and the collector-emitter current.

In accordance with some embodiments, an improved transistor tile includes a first collector region, a second collector region, a base region, and an emitter region. The first collector region longitudinally spans a first side of the transistor tile. The second collector region longitudinally spans a second side of the transistor tile. The base region is located laterally between the first and second collector regions. The emitter region is located laterally between the first and second collector regions. The base region and emitter region are both centered on a longitudinally extending, laterally located midline of the transistor tile.

In accordance with some embodiments, a method includes forming a first collector region longitudinally spanning a first side of a transistor tile; forming a second collector region longitudinally spanning a second side of the transistor tile; forming a base region laterally between the first and second collector regions and centered on a longitudinally extending, laterally located midline of the transistor tile; and forming an emitter region laterally between the first and second collector regions and centered on the longitudinally extending, laterally located midline of the transistor tile.

In some embodiments, the transistor tile has a longitudinal dimension and a lateral dimension in a horizontal plane. The first and second portions and the central portion extend longitudinally within the transistor tile. The first and second portions are located laterally from the central portion. The first and second collector regions extend longitudinally within the first and second portions, respectively.

In some embodiments, the transistor tile also includes first and second base connector regions located within the central portion. The emitter region is located between the first base connector region and the second base connector region. The direction of the flow of the base-emitter current is horizontal between the first and second base connector regions and the emitter region.

In some embodiments, a BJT transistor includes a plurality of the transistor tile. The first collector region of a first one of the plurality of the transistor tile and the first collector region of a second one of the plurality of the transistor tile both form a first common (i.e., shared) collector region of the BJT transistor. The second collector region of the first one of the plurality of the transistor tile and the second collector region of the second one of the plurality of the transistor tile both form a second common collector region of the BJT transistor. The base region of the first one of the plurality of the transistor tile and the base region of the second one of the plurality of the transistor tile both form a common base region of the BJT transistor.

In some embodiments, a BJT transistor includes a plurality of the transistor tile. The second collector region of a first one of the plurality of the transistor tile is shared as the first collector region of a second one of the plurality of the transistor tile of the BJT transistor.

In some embodiments, a BJT transistor includes a plurality of the transistor tile. The first collector region of a first one of the plurality of the transistor tile and the first collector region of a second one of the plurality of the transistor tile both form a first common collector region of the BJT transistor. The second collector region of the first one of the plurality of the transistor tile and the second collector region of the second one of the plurality of the transistor tile both form a second common collector region of the BJT transistor. The second base connector region of the first one of the plurality of the transistor tile is shared as the first base connector region of the second one of the plurality of the transistor tile.

In some embodiments, a BJT transistor includes a plurality of the transistor tile. The second collector region of a first one of the plurality of the transistor tile is shared as the first collector region of a second one of the plurality of the transistor tile of the BJT transistor.

In some embodiments, the transistor tile is formed on a semiconductor-on-insulator wafer.

In some embodiments, the transistor tile also includes a semiconductor layer, a first NLDD region, a first collector N+ region, a second NLDD region, a second collector N+ region, a P-well, a base P+ region, and an emitter N+ region.

The first NLDD region is formed as the first collector region and in the semiconductor layer. The first collector N+ region is formed in the first NLDD region. The second NLDD region is formed as the second collector region and in the semiconductor layer. The second collector N+ region is formed in the second NLDD region. The P-well is formed as the base region and in the semiconductor layer between the first and second NLDD regions. The base P+ region formed in the P-well. The emitter N+ region is formed as the emitter region and in the P-well.

In some embodiments, the transistor tile also includes a semiconductor layer, a first PLDD region, a second PLDD region, an N-well, a base N+ region, an emitter P+ region, a first collector P+ region, and a second collector P+ region. The first PLDD region is formed as the first collector region and in the semiconductor layer. The second PLDD region is formed as the second collector region and in the semiconductor layer. The N-well is formed as the base region and in the semiconductor layer between the first and second PLDD regions. The base N+ region is formed in the N-well. The emitter P+ region is formed as the emitter region and in the N-well. The first collector P+ region is formed in the first PLDD region. The second collector P+ region formed in the second PLDD region.

BRIEF DESCRIPTION OF THE DRAWINGS

FIGS. 5-7 are simplified diagrams of bipolar junction transistor (BJT) devices formed with a plurality of the transistor tile shown in FIGS. 1-4, in accordance with some embodiments.

FIGS. 26 and 27 are tables showing the performance of example horizontal NPN and PNP BJT devices formed with the transistor tile shown in FIGS. 1-4, in accordance with some embodiments, and of an example conventional vertical NPN BJT device.

FIG. 37 is a simplified flowchart for an example method of fabricating the transistor tile shown in FIGS. 1-4.

DETAILED DESCRIPTION

Figure 1:
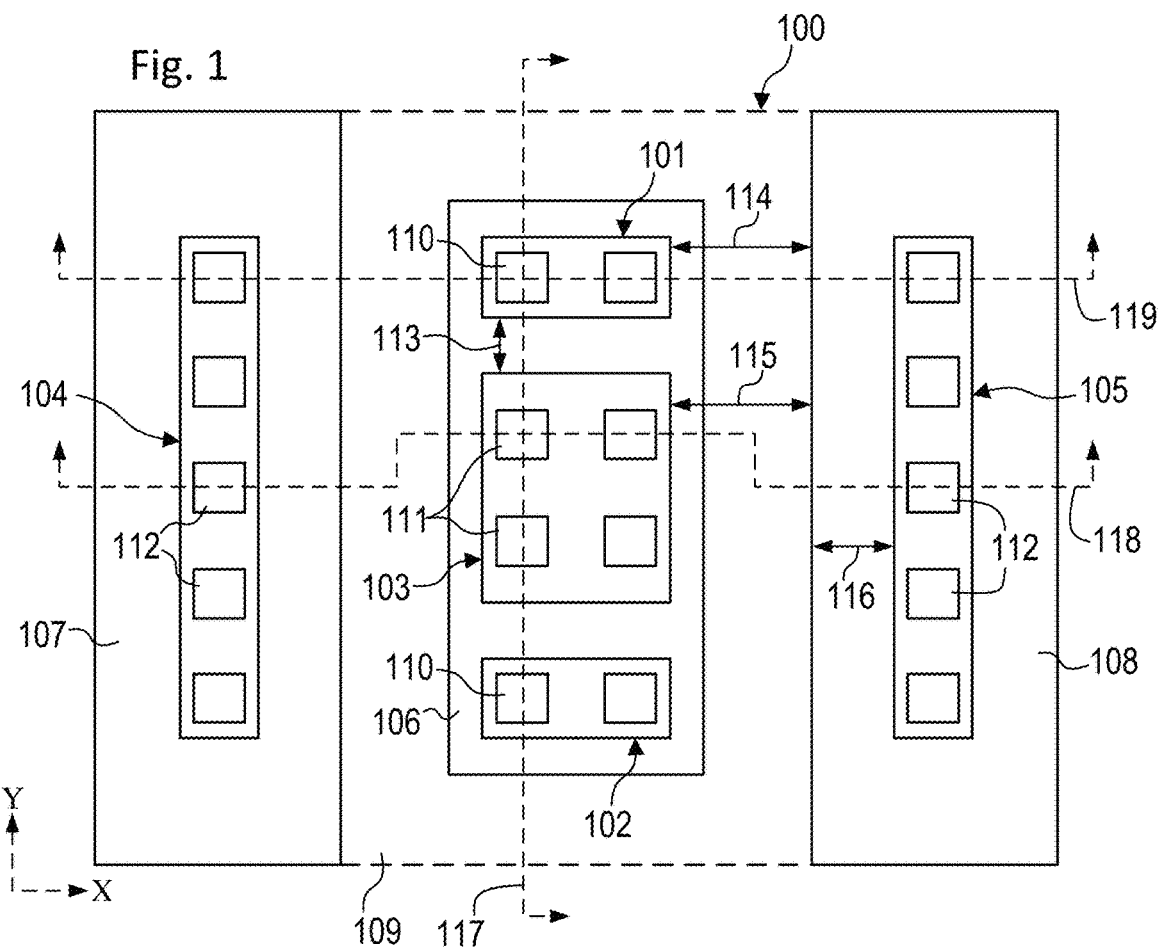
FIG. 1 is a simplified diagram of a transistor tile, in accordance with some embodiments.

The present invention enables embodiments for a general lateral bipolar junction transistor (BJT) design (incorporating BJT tile structures) that allows for a high level of flexibility in design-stage control over device layout, structural feature geometry, and operating parameters of the resulting horizontal or lateral BJT device, including embodiments formed on a semiconductor-on-insulator (SOI) wafer. FIG. 1 shows an example of a transistor tile (i.e., BJT tile structure or BJT cell) 100 that can be used in such a general BJT design, in accordance with some embodiments.

The transistor tile 100 generally includes first and second base connector or tie regions 101 and 102, an emitter region 103, first and second collector connector or tie regions 104 and 105, a base region 106, and first and second collector regions 107 and 108. The emitter region 103 is located between the first and second base connector regions 101 and 102. The first and second base connector regions 101 and 102 and the emitter region 103 are located between the first and second collector connector regions 104 and 105 and the first and second collector regions 107 and 108.

In some embodiments, the transistor tile 100 is part of a lateral NPN BJT. Thus, the base connector regions 101 and 102 are formed as P-plus regions (i.e., base P+ regions formed in the base connector regions 101 and 102); the base region 106 is formed as a P-well, i.e., a P-well base region; the emitter region 103 is formed as an N-plus region (i.e., an emitter N+ region formed in the emitter region 103); the first and second collector regions 107 and 108 are formed as first and second N-type regions with lower dopant concentration than that of the collector connector regions 104 and 105; and the collector connector regions 104 and 105 are formed as N-plus regions (i.e., highly doped ohmic contact collector N+ regions formed in the collector connector regions 104 and 105). (In some embodiments, the first and second collector regions 107 and 108 are formed as NLDD regions, i.e., N-doped lightly doped drain regions, because they may be formed simultaneously with NLDD regions of LDDFETs of the overall electronic circuit of which the transistor tile 100 is a part.) Additionally, the base connector regions 101 and 102 (i.e., the base P+ regions) and the emitter region 103 (i.e., the emitter N+ region) are formed within the P-well base region 106; and the collector connector regions 104 and 105 (i.e., the collector N+ regions) are formed within first and second collector regions 107 and 108, respectively. In some embodiments, the base P+ regions and the emitter N+ region are separated by a portion of the P-well base region 106; whereas in other embodiments, the separation between the base P+ regions and the emitter N+ region is minimized, or the base P+ regions and the emitter N+ region are adjacent to or in contact with each other. Furthermore, the P-well base region 106 and the first and second collector regions 107 and 108 are formed within an N-minus or P-minus region 109, e.g., an intrinsic epitaxial layer or other appropriate semiconductor layer. Also, base contacts 110, emitter contacts 111, and collector contacts 112 are formed on the base connector regions 101 and 102, the emitter regions 103, and the collector connector regions 104 and 105, respectively.

In some embodiments, the transistor tile 100 is formed in and on an SOI wafer, e.g., wherein the semiconductor material is primarily silicon. Thus, the epitaxial layer for the N-minus or P-minus region 109 is grown on top of a buried oxide (not shown in FIG. 1) of the SOI wafer, which overlays a semiconductor substrate. In other embodiments, the transistor tile 100 is formed in and on a bulk semiconductor (e.g., silicon), so the N-minus or P-minus region 109 is formed in or on the bulk semiconductor material.

In some embodiments, transistor tile 100 is part of a lateral PNP BJT. Thus, the above described N and P designations are reversed for these embodiments.

For a typical BJT device, the base-emitter maximum rating voltage (i.e., Vbeo rating or Vebo rating) is the maximum voltage the BJT device can withstand on its base measured relative to its emitter with the collector open circuit. In other words, the Vbeo rating of the BJT device is the maximum allowable voltage that the base-emitter junction of the BJT device can handle before it becomes damaged or destroyed, i.e., it is the breakdown voltage rating for the base-emitter junction of the BJT device. In FIG. 1, arrow 113 indicates a horizontal distance between the base connector regions 101 and 102 and the emitter region 103 (i.e., the base-emitter distance). The Vbeo rating of the transistor tile 100 is at least partly dependent on, or controlled by, the base-emitter distance (arrow 113). During design of the BJT device (of which the transistor tile 100 is a part), therefore, the base-emitter distance (arrow 113) can be set, thereby providing control over the resulting Vbeo rating of the BJT device.

Additionally, for a typical BJT device, the collector-base maximum rating voltage (i.e., Vcbo rating or Vbco rating) is the maximum voltage the BJT device can withstand on its collector measured relative to its base with the emitter open circuit. In other words, the Vcbo rating of the BJT device is the maximum allowable voltage that the collector-base junction of the BJT device can handle before it becomes damaged or destroyed, i.e., it is the breakdown voltage rating for the collector-base junction of the BJT device. In FIG. 1, arrow 114 indicates a horizontal distance between the base connector regions 101 and 102 and the nearest edge of the collector regions 107 and 108 (i.e., the base-collector distance). The Vcbo rating of the transistor tile 100 is at least partly dependent on, or controlled by, the base-collector distance (arrow 114). During design of the BJT device (of which the transistor tile 100 is a part), therefore, the base-collector distance (arrow 114) can be set, thereby providing control over the resulting Vcbo rating of the BJT device.

Additionally, for a typical BJT device, the collector-emitter maximum rating voltage (i.e., Vceo rating or Veco rating) is the maximum voltage the BJT device can withstand on its collector measured relative to its emitter with the base open circuit. It is likely to be less than the Vcbo rating, because leakage across the reverse biased collector-base junction provides base current that starts to turn the transistor on. In other words, the Vceo rating of the BJT device is the maximum allowable voltage across the collector and emitter that the BJT device can handle before it becomes damaged or destroyed, i.e., it is the breakdown or maximum voltage rating across the collector and emitter of the transistor. In FIG. 1, arrow 115 indicates a distance between the emitter region 103 and the nearest edge of the collector regions 107 and 108 (i.e., the emitter-collector distance). The Vceo rating of the transistor tile 100 is at least partly dependent on, or controlled by, the emitter-collector distance (arrow 115). During design of the BJT device (of which the transistor tile 100 is a part), therefore, the emitter-collector distance (arrow 115) can be set, thereby providing control over the resulting Vceo rating of the BJT device.

Furthermore, arrow 116 indicates a distance between the collector connector regions 104 and 105 and the edge of the collector regions 107 and 108 (i.e., the collector enclosure distance, or the collector extension). A ratio of the Vcbo rating to the Vceo rating of the transistor tile 100 is at least partly dependent on, or controlled by, the collector enclosure distance (arrow 116). During design of the BJT device (of which the transistor tile 100 is a part), therefore, the collector enclosure distance (arrow 116) can be set, thereby providing control over the resulting Vcbo rating to Vceo rating ratio of the BJT device.

During the design of the BJT device (of which the transistor tile 100 is a part), the ability to adjust the geometry of the tile structure by setting these distances (the base-emitter distance, the base-collector distance, the emitter-collector distance, and the collector enclosure distance) and the functional controls that such adjustability enables (i.e., adjustable control parameters of the various maximum rating voltages and ratios) provide a high level of flexibility in design-stage control over structural feature geometry, operating parameters and desired performance characteristics of the resulting horizontal or lateral BJT device. By comparison, the structural feature geometry and operating parameters of a conventional vertical BJT device are not as readily adjustable.

Figure 2:
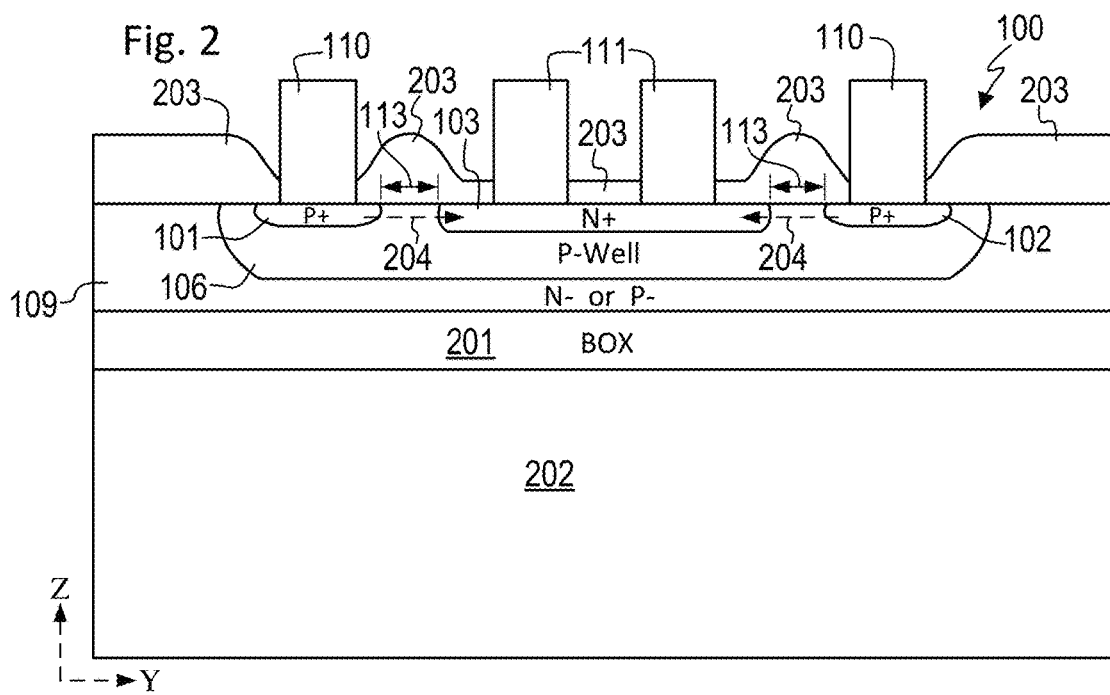
FIGS. 2-4 are simplified cross section diagrams of the transistor tile shown in FIG. 1, in accordance with some embodiments.
Figure 3:
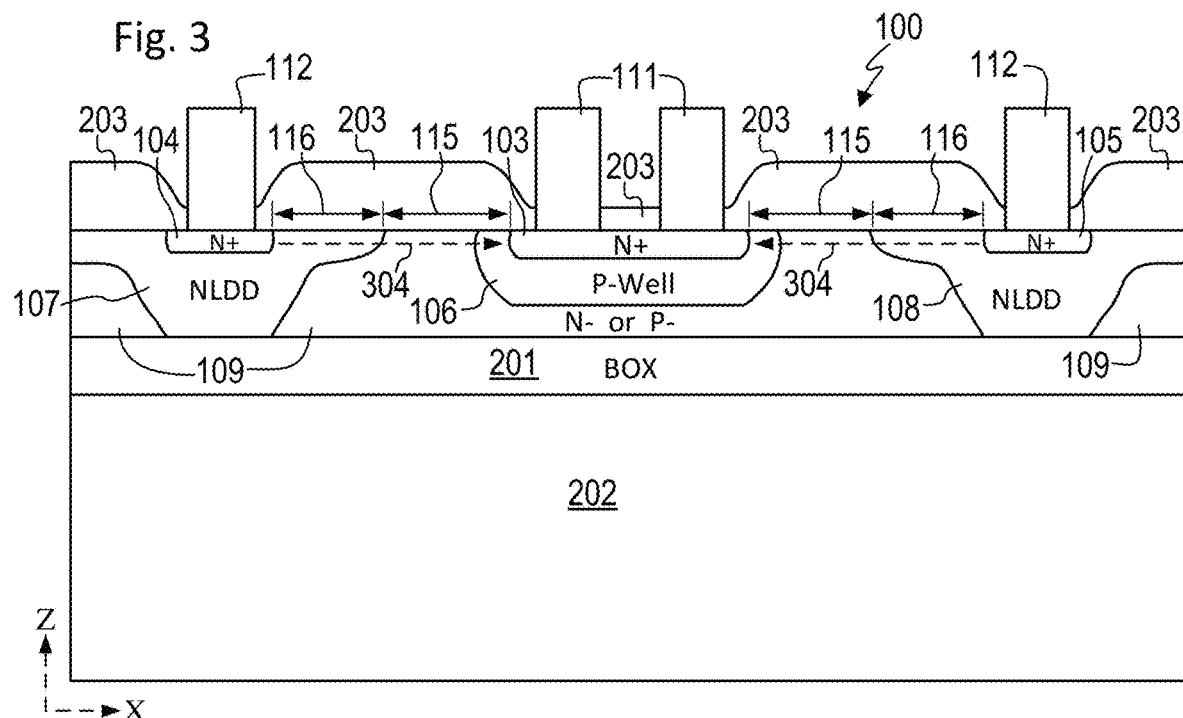
Figure 4:
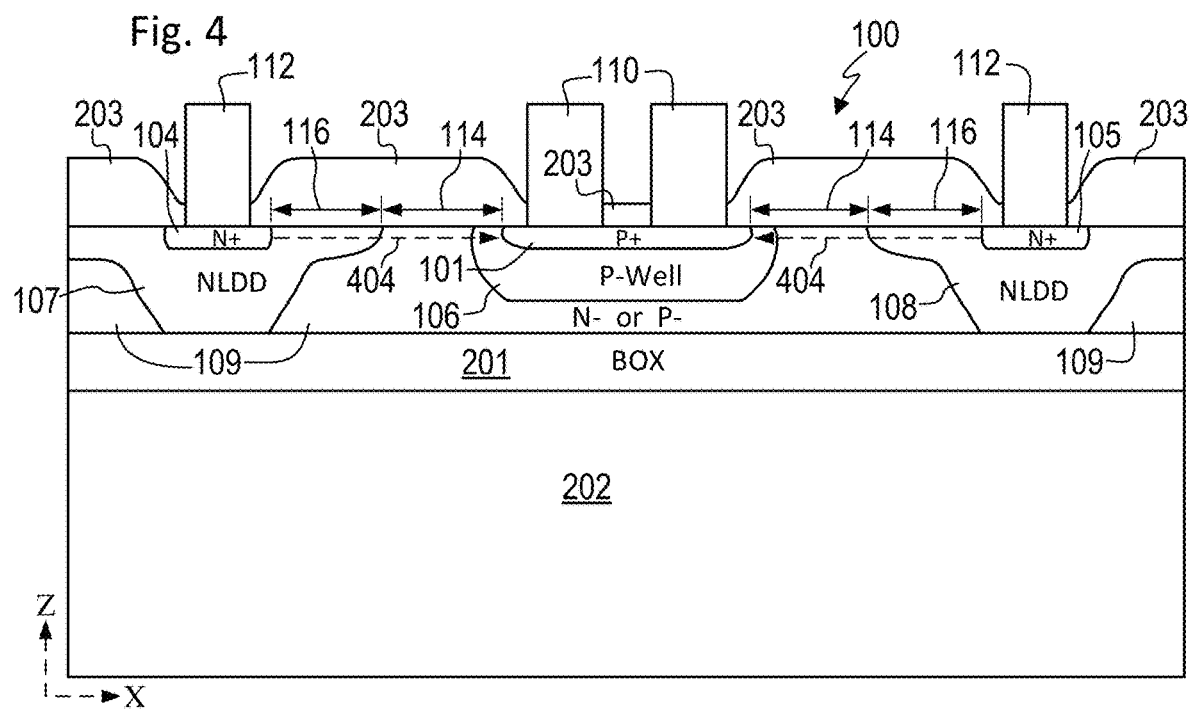

FIGS. 2, 3 and 4 show example cross sections of the transistor tile 100 taken along section, or cut, lines 117, 118 and 119, respectively, further illustrating an example of the layout and structural feature geometry of the transistor tile 100. The example shown is for a lateral NPN BJT device. For a lateral PNP BJT device, on the other hand, the illustrated N and P designations are reversed.

FIG. 2 (cross section through cut line 117) shows an active region containing the first and second base connector regions 101 and 102, the emitter region 103, the P-well base region 106, and the N-minus or P-minus region 109. The base contacts 110 and the emitter contacts 111 (e.g., metal or other electrical conductors that connect to overlying metallization layers, not shown) are also shown. Additionally, a buried oxide (BOX) 201 and an underlying substrate 202 are shown for embodiments formed in and on an SOI wafer. The BOX 201 is optional, since other embodiments may be formed in and on a bulk semiconductor wafer, i.e., without a buried oxide. Furthermore, a field oxide 203 is shown overlying the active region. The arrows 113 are also shown to indicate the aforementioned base-emitter distance. Additionally, directions of flows of base-emitter currents are indicated by arrows 204 between the base connector regions 101 and 102 and the emitter region 103 and through the base region 106.

FIG. 3 (cross section through cut line 118) shows the active region containing the emitter region 103, the first and second collector connector regions 104 and 105, the P-well base region 106, the first and second collector regions 107 and 108, and the N-minus or P-minus region 109. The emitter contacts 111 and the collector contacts 112 (e.g., metal or other electrical conductors that connect to overlying metallization layers, not shown) are also shown. Additionally, the BOX 201 and the underlying substrate 202 are shown for embodiments formed in and on an SOI wafer. The BOX 201 is optional, since other embodiments may be formed in and on a bulk semiconductor wafer, i.e., without a buried oxide. Furthermore, the field oxide 203 is shown overlying the active region. The arrows 115 and 116 are also shown to indicate the aforementioned emitter-collector distance and collector enclosure distance, respectively. Additionally, directions of flows of collector-emitter currents are indicated by arrows 304 between the first and second collector connector regions 104 and 105 and the emitter region 103 and through the base region 106.

FIG. 4 (cross section through cut line 119) shows the active region containing the first base connector region 101, the first and second collector connector regions 104 and 105, the P-well base region 106, the first and second collector regions 107 and 108, and the N-minus or P-minus region 109. The base contacts 110 and the collector contacts 112 are also shown. Additionally, the BOX 201 and the underlying substrate 202 are shown for embodiments formed in and on an SOI wafer. The BOX 201 is optional, since other embodiments may be formed in and on a bulk semiconductor wafer, i.e., without a buried oxide. Furthermore, the field oxide 203 is shown overlying the active region. The arrows 114 and 116 are also shown to indicate the aforementioned base-collector distance and collector enclosure distance, respectively. Additionally, directions of flows of base-collector currents are indicated by arrows 404 between the first and second collector connector regions 104 and 105 and the first and second base connector regions 101 and 102 and through the base region 106.

As mentioned above, the transistor tile 100 is part of a horizontal or lateral (NPN or PNP) BJT device. The terms "horizontal" and "lateral" refer to the plane of the transistor tile 100 shown in FIG. 1. Thus, FIGS. 1 and 2 illustrate that the transistor tile 100 is generally formed within a horizontal or lateral length or longitudinal dimension (in direction Y) in the horizontal plane; FIGS. 1, 3 and 4 illustrate that the transistor tile 100 is generally formed within a horizontal or lateral width or lateral dimension (in direction X) in the horizontal plane; and FIGS. 2-4 illustrate that the transistor tile 100 is generally formed within a vertical thickness (in direction Z). Given the illustrations in FIGS. 1-4 and these definitions of horizontal/lateral, vertical, length, width and thickness, the following relationships between the first and second base connector regions 101 and 102, the emitter region 103, and the first and second collector connector regions 104 and 105 are described. Directions of flows of base-emitter currents (arrows 204, FIG. 2) are generally lengthwise (direction Y) horizontal or lateral between the base connector regions 101 and 102 and the emitter region 103. Directions of flows of collector-emitter currents (arrows 304, FIG. 3) are generally widthwise (direction X) horizontal or lateral between the first and second collector connector regions 104 and 105 and the emitter region 103. Directions of flows of base-collector currents (arrows 404, FIG. 4) are generally widthwise (direction X) horizontal or lateral between the first and second collector connector regions 104 and 105 and the first and second base connector regions 101 and 102. The directions of the flows of the base-emitter currents 204 are generally perpendicular to the directions of the flows of the base-collector current 404 and the collector-emitter current 304. The first and second collector connector regions 104 and 105 (e.g., fingerlike structures) are located within first and second lateral portions of the transistor tile 100 that extend longitudinally or lengthwise therein. The first and second base connector regions 101 and 102 and the emitter region 103 (e.g., island-like structures) are located within a central portion of the transistor tile 100 that extends longitudinally or lengthwise therein, such that the first and second base connector regions 101 and 102 and the emitter region 103 are both centered on a longitudinally extending, laterally located midline of the transistor tile 100. The first and second lateral portions of the transistor tile 100 are located laterally from the central portion thereof, such that the first and second base connector regions 101 and 102 and the emitter region 103 are located laterally between the first and second collector connector regions 104 and 105. The emitter region 103 is located longitudinally between the first and second base connector regions 101 and 102. The first and second collector connector regions 104 and 105 extend longitudinally within the first and second lateral portions of the transistor tile 100; thereby longitudinally spanning first and second sides, respectively, of the transistor tile 100.

The above-described structural feature geometry of the transistor tile 100 enables a high level of flexibility in design-stage control over device layout for the resulting lateral BJT device, as illustrated by lateral BJT transistors 500, 600 and 700 in FIGS. 5, 6 and 7, respectively. The lateral BJT transistors 500, 600 and 700 are formed with a plurality of the lateral transistor tile 100 arranged in a variety of overlapping configurations. The example configurations for the BJT transistors 500, 600 and 700 are shown for illustrative and explanatory purposes only. Other examples may have a variety other appropriate configurations with other numbers of transistor tiles that connect or overlap in the manner described below.

The BJT transistor 500 (FIG. 5) includes four overlapping transistor tiles 501-504 (each similar to the transistor tile 100) arranged in a 2×2 array or grid. Transistor tiles that are adjacent to each other share components.

For example, the transistor tiles 501 and 502 share a first portion of a common collector connector region 505 and the collector contacts 112 therein. In other words, the second collector connector region (e.g., similar to 105 in FIG. 1) of the transistor tile 501 is shared as the first collector connector region (e.g., similar to 104 in FIG. 1) of the transistor tile 502 within the first portion of the common collector connector region 505. Similarly, transistor tiles 503 and 504 share a second portion of the common collector connector region 505 and the collector contacts 112 therein. In other words, the second collector connector region (e.g., similar to 105 in FIG. 1) of the transistor tile 503 is shared as the first collector connector region (e.g., similar to 104 in FIG. 1) of the transistor tile 504 within the second portion of the common collector connector region 505. Similarly, the transistor tiles 501 and 502 share a first portion of a single common collector region 515. In other words, the second collector region (e.g., similar to 108 in FIG. 1) of the transistor tile 501 is shared as the first collector region (e.g., similar to 107 in FIG. 1) of the transistor tile 502 within the first portion of the common collector region 515. Similarly, transistor tiles 503 and 504 share a second portion of the common collector region 515. In other words, the second collector region (e.g., similar to 108 in FIG. 1) of the transistor tile 503 is shared as the first collector region (e.g., similar to 107 in FIG. 1) of the transistor tile 504 within the second portion of the common collector region 515.

Additionally, the transistor tiles 501 and 503 share a common base connector region 506. In other words, the second base connector region (e.g., similar to 102 in FIG. 1) of the transistor tile 501 is shared as the first base connector region (e.g., similar to 101 in FIG. 1) of the transistor tile 503, thereby forming the common base connector region 506. The transistor tiles 502 and 504 similarly share a common base connector region 507. Similarly, the transistor tiles 501 and 503 share a single common base region 513. In other words, the base region (e.g., similar to 106 in FIG. 1) of the transistor tile 501 is shared as the base region (e.g., similar to 106 in FIG. 1) of the transistor tile 503, thereby forming the common base region 513. The transistor tiles 502 and 504 similarly share a single common base region

514. The common base regions 513 and 514, thus, extend longitudinally or lengthwise within portions of the BJT transistor 500.

Additionally, the first collector connector region (e.g., similar to 104 in FIG. 1) of the transistor tile 501 and the first collector connector region (e.g., similar to 104 in FIG. 1) of the transistor tile 503 connect or overlap (e.g., at a common collector contact 508) to form a single first common collector connector region 509 of the BJT transistor 500. Similarly, the second collector connector region (e.g., similar to 105 in FIG. 1) of the transistor tile 501 and the second collector connector region (e.g., similar to 105 in FIG. 1) of the transistor tile 503 connect or overlap (e.g., at a common collector contact 510) to form a single second common collector connector region (i.e., the common collector connector region 505) of the BJT transistor 500. Similarly, the first collector region (e.g., similar to 107 in FIG. 1) of the transistor tile 501 and the first collector region (e.g., similar to 107 in FIG. 1) of the transistor tile 503 connect or overlap to form a single first common collector region 516 of the BJT transistor 500. Similarly, the second collector region (e.g., similar to 108 in FIG. 1) of the transistor tile 501 and the second collector region (e.g., similar to 108 in FIG. 1) of the transistor tile 503 connect or overlap to form a single second common collector region (i.e., the common collector region 515) of the BJT transistor 500.

Also, since the second collector connector regions of the transistor tiles 501 and 503 are shared as the first collector connector regions of the transistor tiles 502 and 504, the first collector connector regions (e.g., similar to 104 in FIG. 1) of the transistor tiles 502 and 504 also connect or overlap (e.g., at the common collector contact 510) to form the single second common collector connector region (i.e., the common collector connector region 505) of the BJT transistor 500. Similarly, the second collector connector regions (e.g., similar to 105 in FIG. 1) of the transistor tiles 502 and 504 also connect or overlap (e.g., at a common collector contact 511) to form a single third common collector connector region 512 of the BJT transistor 500. Similarly, since the second collector regions of the transistor tiles 501 and 503 are shared as the first collector regions of the transistor tiles 502 and 504, the first collector regions (e.g., similar to 107 in FIG. 1) of the transistor tiles 502 and 504 also connect or overlap to form the single second common collector region (i.e., the common collector region 515) of the BJT transistor 500. Similarly, the second collector regions (e.g., similar to 108 in FIG. 1) of the transistor tiles 502 and 504 also connect or overlap to form a single third common collector region 517 of the BJT transistor 500.

The common collector contact 510, thus, is shared by or between all of the transistor tiles 501-504. Additionally, the common collector connector regions 505, 509 and 512 extend longitudinally or lengthwise within portions of the BJT transistor 500. Similarly, the common collector regions 515, 516 and 517 extend longitudinally or lengthwise within portions of the BJT transistor 500.

The BJT transistor 600 (FIG. 6) includes thirty overlapping transistor tiles (each similar to the transistor tile 100) arranged in a 6×5 array or grid of rows and columns. Transistor tiles that are adjacent to each other share components in a manner similar to that described above for the transistor tiles 501-504 of the BJT transistor 500 in FIG. 5. Thus, the transistor tiles in a first column 601 share common collector regions with the transistor tiles in an adjacent second column 602, and likewise for each pair of adjacent, connected or overlapping columns of transistor tiles. Additionally, the transistor tiles in a first row 603 share common base regions and have connected or overlapping collector regions with the transistor tiles in an adjacent second row 604, and likewise for each pair of adjacent, connected or overlapping rows of transistor tiles. Therefore, the BJT transistor 600 can be characterized as having an N×M array or grid, wherein each row overlaps at least one other row, each column overlaps at least one other column, and each row/column position contains one of the transistor tiles 100.

The BJT transistor 700 (FIG. 7) includes thirty overlapping transistor tiles (each similar to the transistor tile 100) arranged in a 12×4 array or grid of rows and columns. The BJT transistor 700 can be characterized as having an N×M array or grid, wherein each row overlaps at least one other row, each column overlaps at least one other column, and each row/column position either contains one of the transistor tiles 100 or is empty of a transistor tile. The empty row/column positions may contain or be at least partially filled with other structures or components of the overall electronic circuit of which the BJT transistor 700 is a part. Thus, the BJT transistor 700 may also be characterized as having overlapping rows and columns of the transistor tiles 100 that at least partially wrap around or at least partially surround some of the other structures or components of the overall electronic circuit. Alternatively, the BJT transistor 700 may be characterized as having a chain-like layout of a plurality of the transistor tiles 100 that overlap each other in a configuration that at least partially wraps around or at least partially surrounds some of the other structures or components of the overall electronic circuit. Therefore, each transistor tile 100 in the BJT transistor 700 overlaps at least one other transistor tile 100, thereby either (1) sharing common collector regions, or (2) sharing common base regions and having connected or overlapping collector regions, as described above. The BJT transistor 700, thus, illustrates that the transistor tiles 100 can be arranged in a variety of multiple complex shapes to fill available portions of the overall circuit layout that are otherwise empty of other structures or components of the overall electronic circuit of which the BJT transistor 700 is a part. In this manner, the above-described structural feature geometry of the transistor tile 100 enables a high level of flexibility in design-stage control over device layout for the resulting lateral BJT device and optimizes placement and layout of the BJT device within an integrated circuit that would otherwise exhibit highly restrictive spatial constraints, while still maintaining or setting desired performance characteristics for the BJT device.

Conventional circuit layout techniques for BJT devices generally require that transistor tiles or cells be arranged in a rectangular structure to form the BJT device. In order to fit the rectangular structure into an overall circuit layout, therefore, the footprint of the overall circuit layout might have to be increased to provide sufficient space for the rectangular structure, thereby potentially resulting in having to make revisions to the overall circuit layout. Thus, the ability of the transistor tiles 100 to be arranged in a variety of multiple complex shapes, as illustrated by the example in FIG. 7, allows for optimum usage of available space within an existing overall circuit layout, thereby minimizing any potential need to revise the overall circuit layout to fit the resulting BJT device into the overall circuit layout. The time for and cost of designing the BJT device and the overall circuit are thus reduced.

Figure 8:
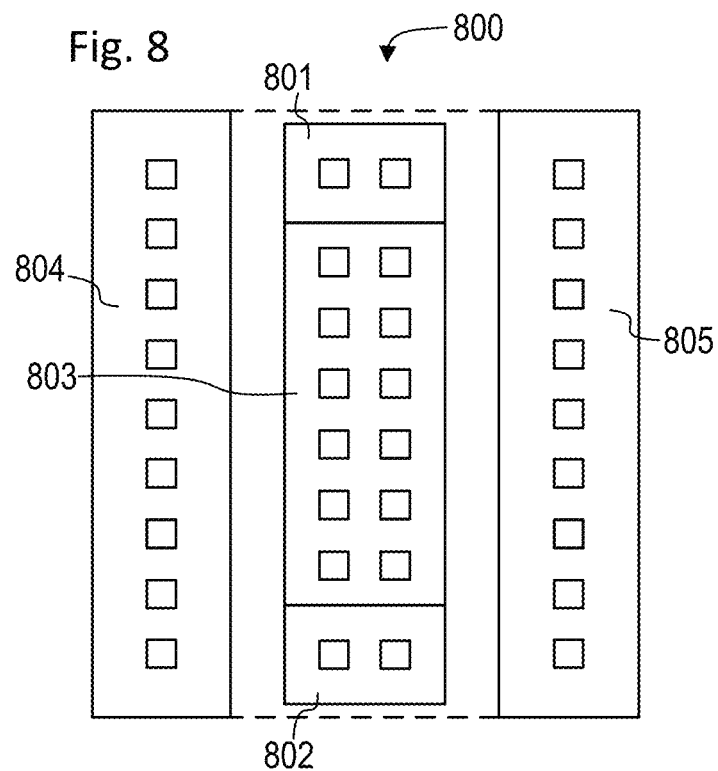
FIGS. 8 and 9 are simplified diagrams of alternative transistor tiles, in accordance with some embodiments.
Figure 9:
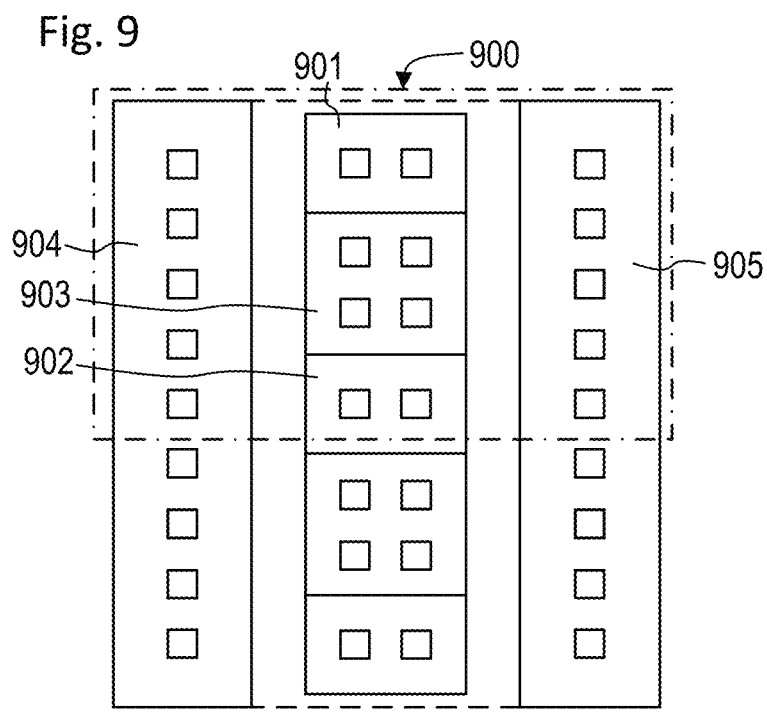

FIGS. 8 and 9 illustrate alternative structures for transistor tiles 800 and 900 that enable additional flexibility in design-stage control over structural feature geometry and operating parameters of the resulting horizontal or lateral BJT device.

(FIG. 9 shows two adjacent, overlapping transistor tiles 900.) Except as described herein, the transistor tiles 800 and 900 are the same or similar to the transistor tile 100 described above.

The transistor tile 800 generally includes first and second base connector regions 801 and 802 and an emitter region 803 formed in an N-well or P-well base region; and first and second collector regions 804 and 805, along with other features shown in FIGS. 1-4, but not shown in FIG. 8 for simplicity. The transistor tiles 900 generally include first and second base connector regions 901 and 902 and an emitter region 903 formed in an N-well or P-well base region; and first and second collector regions 904 and 905, along with other features shown in FIGS. 1-4, but not shown in FIG. 9 for simplicity. The base-emitter distance (e.g., as illustrated by arrow 113 in FIGS. 1 and 2) in both of the transistor tiles 800 and 900 is shown as minimized, so that the base connector regions 801/802/901/902 (e.g., the base P+ region) and the emitter regions 803/903 (e.g., the emitter N+ region) appear to be adjacent to each other, but any appropriate base-emitter distance may be used, depending on design parameters or desired performance characteristics of the resulting BJT device.

The emitter region 803 is shown considerably elongated compared to the emitter region 903, so that the horizontal or lateral area of the emitter region 803 is larger than that of the emitter region 903, e.g., approximately three times larger in the examples shown, although the emitter region 803 or 903 may be any appropriate size depending on desired performance characteristics of the resulting BJT device. The base connector regions 801 and 802, on the other hand, are shown as approximately the same size as the base connector regions 901 and 902, although the base connector regions 801/802/901/902 may also be any appropriate size depending on desired performance characteristics of the resulting BJT device. The ratio of the emitter area to the base area is thus larger for the transistor tile 800 than it is for the transistor tile 900, e.g., approximately three times larger in the examples shown, but the emitter-to-base area ratio may have any appropriate value depending on desired performance characteristics of the resulting BJT device. In the examples shown in FIGS. 8 and 9, the larger emitter-to-base area ratio of the transistor tile 800 resulted in an approximately 20% larger current gain, amplification, or beta for the resulting BJT device comprising the transistor tile 800 when compared to that of the transistor tile 900. In other words, this ratio controls the beta of the transistor tile or the resulting BJT device. The examples of FIGS. 8 and 9, thus, illustrate another adjustable control parameter that enables additional control over operating parameters and desired performance characteristics (e.g., the beta) for the resulting BJT device due to the high level of flexibility in design-stage control over structural feature geometry of the transistor tiles 800 and 900.

FIGS. 10-36 provide graphs and tables showing the performance of example improved tiled horizontal or lateral BJT devices formed with various embodiments of the transistor tile 100, along with an example conventional vertical BJT device for comparison. The data available in these graphs and tables illustrate that the example improved horizontal BJT devices perform or function as well or better than does the conventional vertical BJT device provided for comparison.

The graphs in FIGS. 10-17 provide Gummel plots showing the performance of embodiments of example horizontal NPN BJT devices formed on an SOI wafer and with a plurality of the transistor tile 100, each including the P-well base, and each with slightly different structural feature geometry. For all of the graphs, the left scale (Y) provides the Amps for the base current (Ib) and the collector current (Ic), and the right scale provides the resulting amplification or beta, for each as a function of the base voltage (Vb) (bottom scale). Additionally, the emitter voltage (Ve) was held at zero volts (i.e., ground), and the base voltage (Vb) was varied from 0 to 1.3 volts in all examples. For the graphs in FIGS. 10, 12, 14 and 16, the collector voltage (Vc) was held at 1.5 volts; and for the graphs in FIGS. 11, 13, 15 and 17, the collector voltage (Vc) was held at 6 volts. (With the emitter voltage Ve held at zero/ground, the collector voltage Vc is also the collector-emitter voltage Vce.) Some of the results of these examples are provided in the tables in FIGS. 26 and 27 described below.

Figure 10:
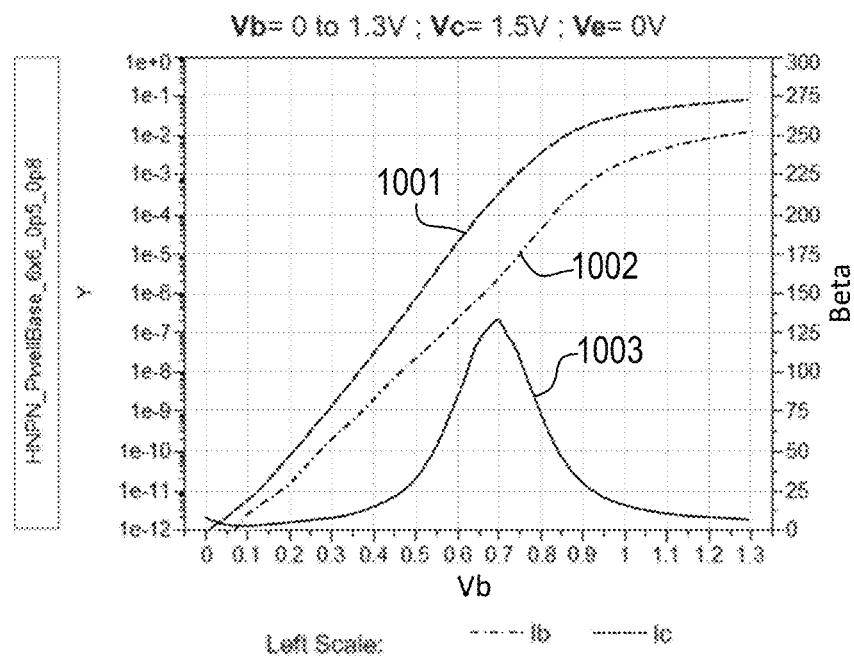
FIGS. 10-17 are simplified graphs showing the performance of example horizontal NPN BJT devices formed with the transistor tile shown in FIGS. 1-4, in accordance with some embodiments.
Figure 11:
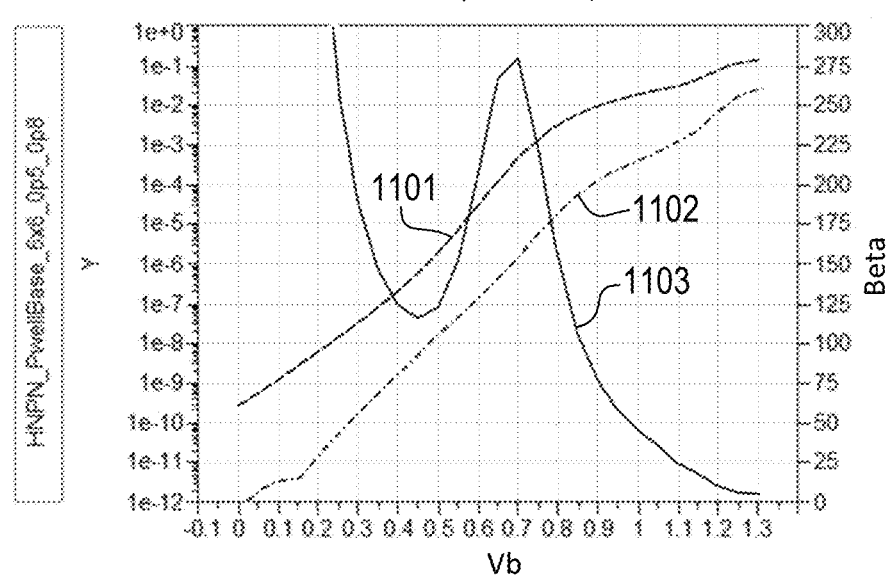
Figure 12:
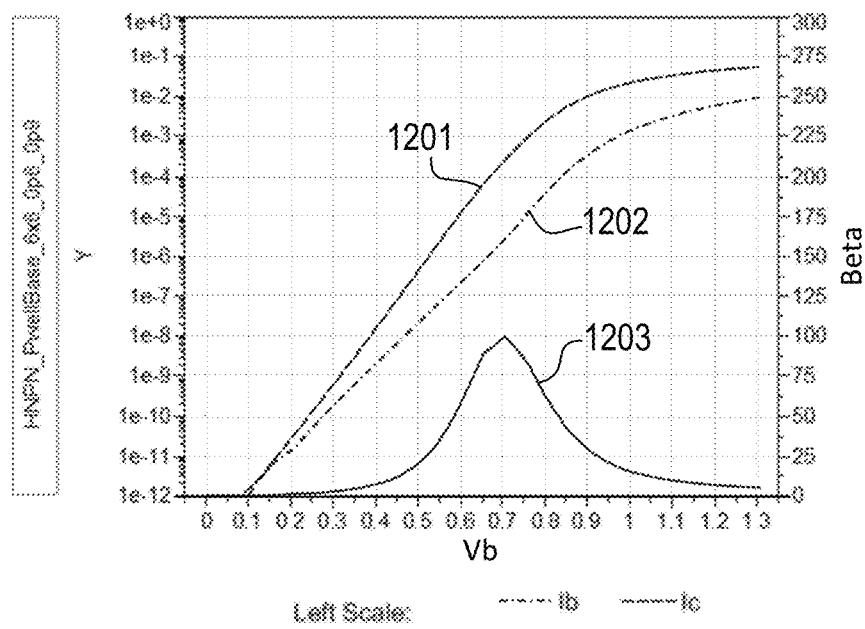
Figure 13:
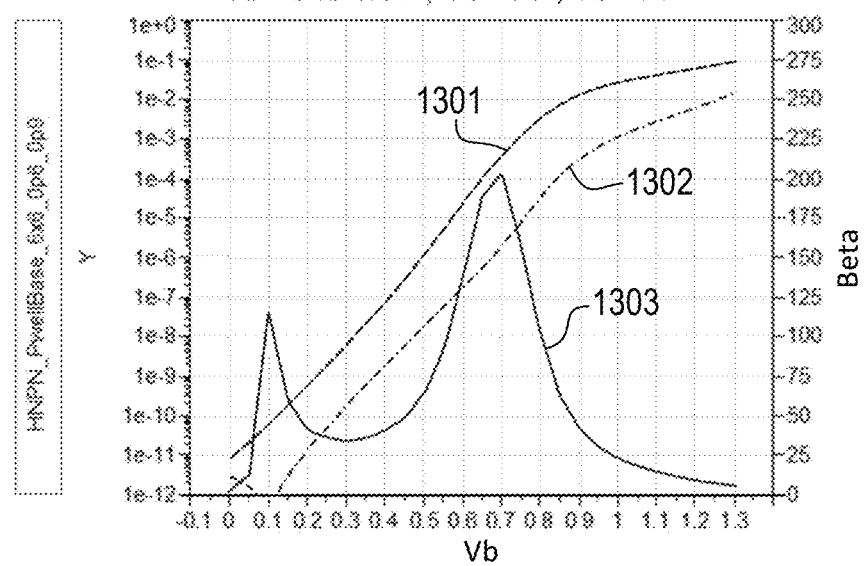
Figure 14:
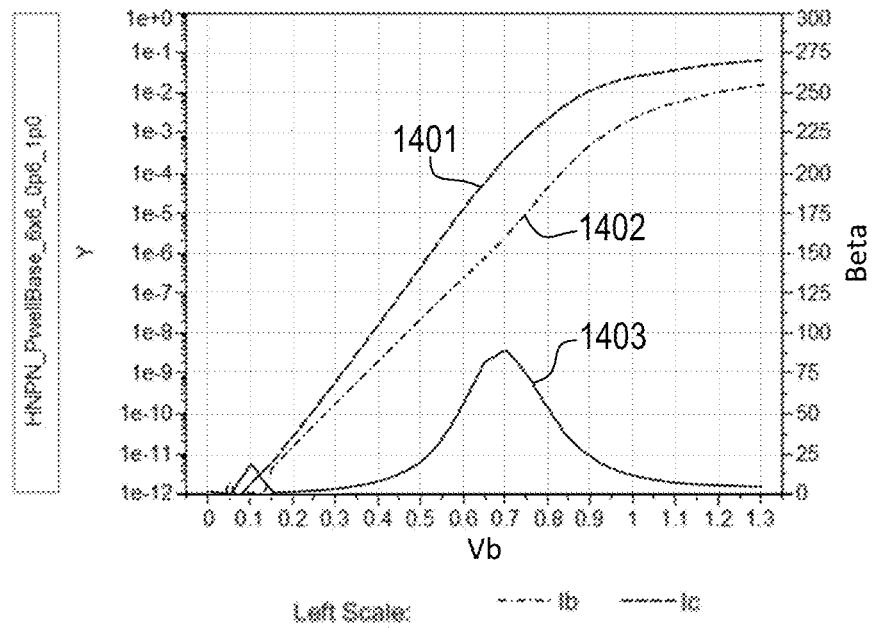
Figure 15:
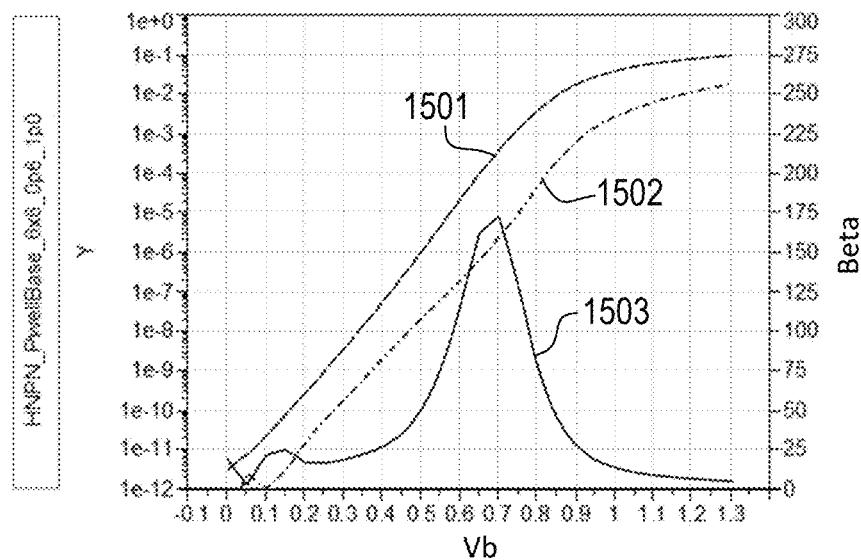
Figure 16:
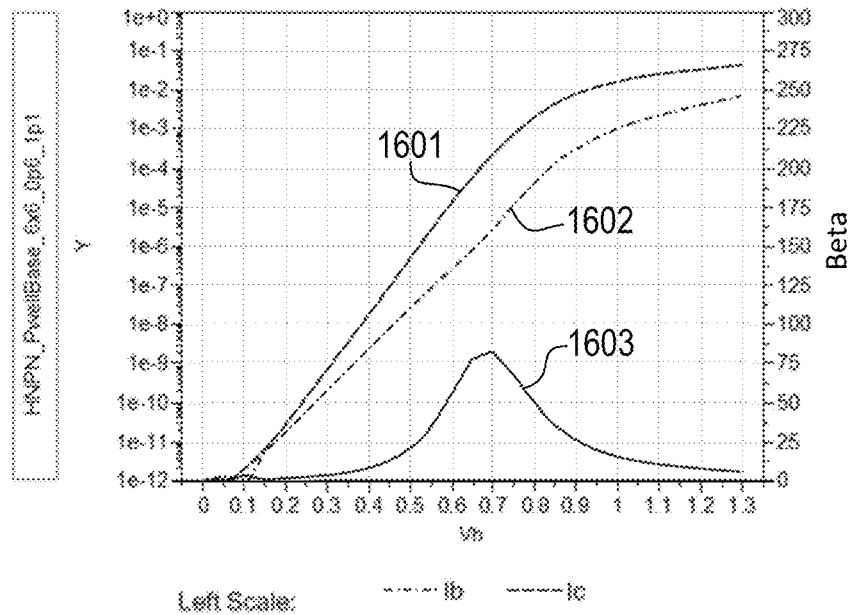
Figure 17:
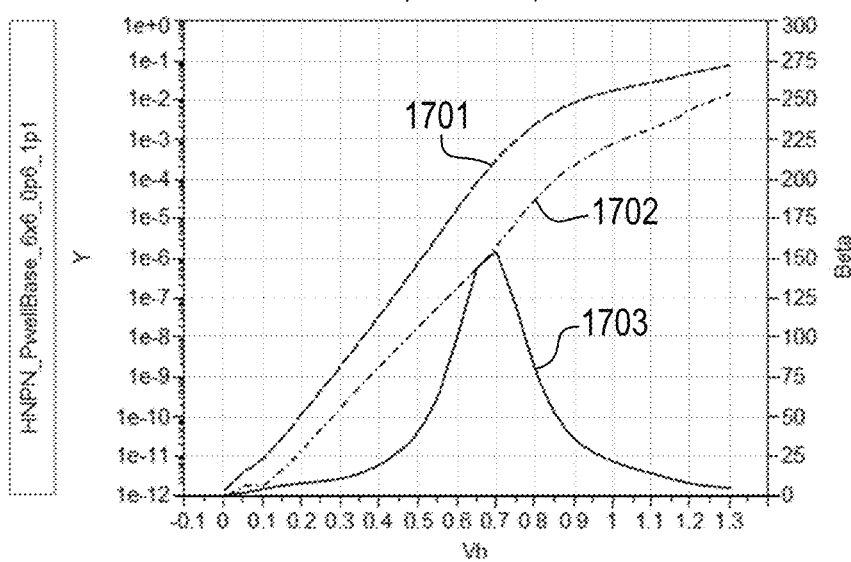

For graphs 1001-1003 and 1101-1103 in FIGS. 10 and 11, respectively, the example NPN BJT device (designated HNPN_PwellBase_6×6_0p5_0p8) had a 6×6 array or grid of the transistor tiles 100 with a 0.5 um collector enclosure distance (or LDD extension, e.g., arrow 116 in FIGS. 1, 3 and 4) and a 0.8 um collector to base distance (e.g., arrow 114 in FIGS. 1 and 4). For graphs 1201-1203 and 1301-1303 in FIGS. 12 and 13, respectively, the example NPN BJT device (designated HNPN_PwellBase_6×6_0p6_0p9) had a 6×6 array or grid of the transistor tiles 100 with a 0.6 um collector enclosure distance and a 0.9 um collector to base distance. For graphs 1401-1403 and 1501-1503 in FIGS. 14 and 15, respectively, the example NPN BJT device (designated HNPN_PwellBase_6×6_0p6_1p0) had a 6×6 array or grid of the transistor tiles 100 with a 0.6 um collector enclosure distance and a 1.0 um collector to base distance. For graphs 1601-1603 and 1701-1703 in FIGS. 16 and 17, respectively, the example NPN BJT device (designated HNPN_PwellBase_6×6_0p6_1p1) had a 6×6 array or grid of the transistor tiles 100 with a 0.6 um collector enclosure distance and a 1.1 um collector to base distance.

Figure 18:
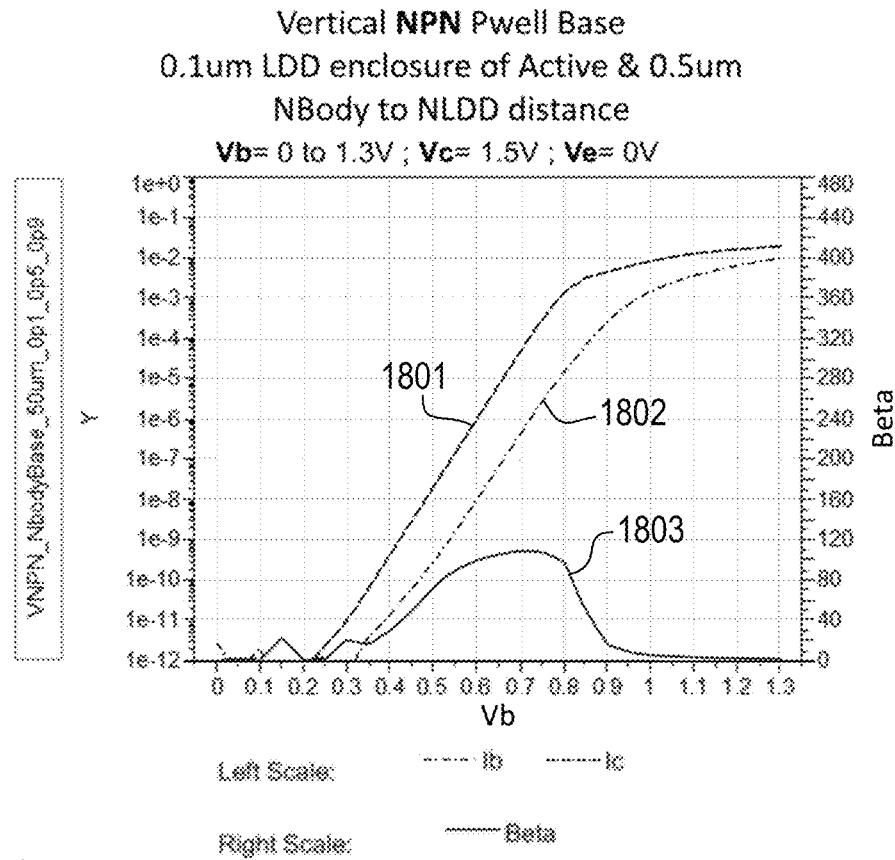
FIGS. 18 and 19 are simplified graphs showing the performance of an example conventional vertical NPN BJT device.
Figure 19:
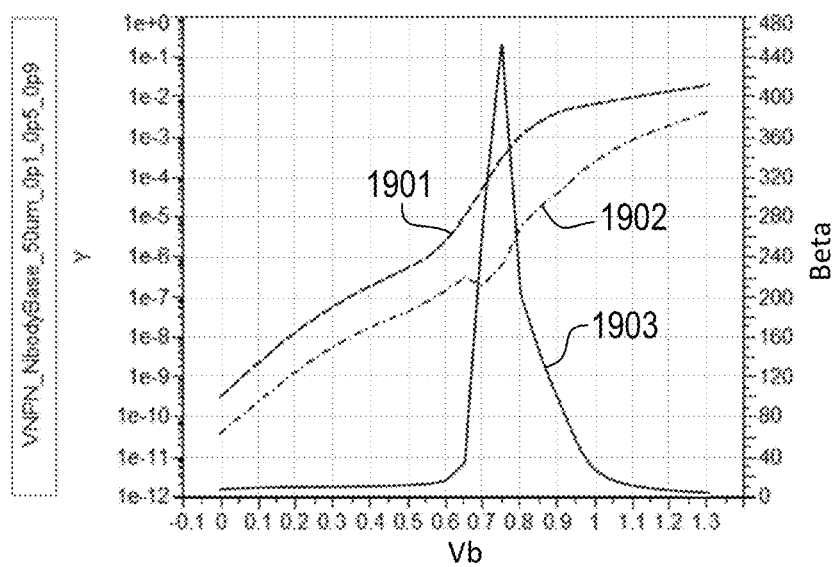

Graphs 1801-1803 and 1901-1903 in FIGS. 18 and 19, respectively, provide Gummel plots showing the performance of an example conventional vertical NPN BJT device (designated VNPN_NbodyBase_50um_0p1_0p5_0p9), including a P-well base, a 0.1 um collector (LDD) enclosure of the active region, and a 0.5 um NBody to collector (NLDD) distance. For all of the graphs, the left scale (Y) provides the Amps for the base current (Ib) and the collector current (Ic), and the right scale provides the resulting beta, for each as a function of the base voltage (Vb) (bottom scale). Additionally, the emitter voltage (Ve) was held at zero volts (i.e., ground), and the base voltage (Vb) was varied from 0 to 1.3 volts in all examples. For the graphs 1801-1803 in FIG. 18, the collector voltage (Vc) was held at 1.5 volts; and for the graphs 1901-1903 in FIG. 19, the collector voltage (Vc) was held at 6 volts. Some of the results of these examples are provided in the tables in FIGS. 26 and 27 described below.

The graphs in FIGS. 20-25 provide Gummel plots showing the performance of embodiments of example horizontal PNP BJT devices formed on an SOI wafer and with a plurality of the transistor tile 100, each including an N-well base, and each with slightly different structural feature geometry. For all of the graphs, the left scale (Y) provides the Amps for the base current (Ib) and the collector current (Ic), and the right scale provides the resulting beta, for each as a function of the base voltage (Vb) (bottom scale). Additionally, the emitter voltage (Ve) was held at zero volts (i.e., ground), the base voltage (Vb) was varied from 0 to −1.3 volts (absolute value |Vb| is plotted for ease of comparison with NPN examples above), and the collector voltage (Vc) was held at −1.5 volts in all examples. Some of the results of these examples are provided in one of the tables in FIG. 26 described below.

Figure 20:
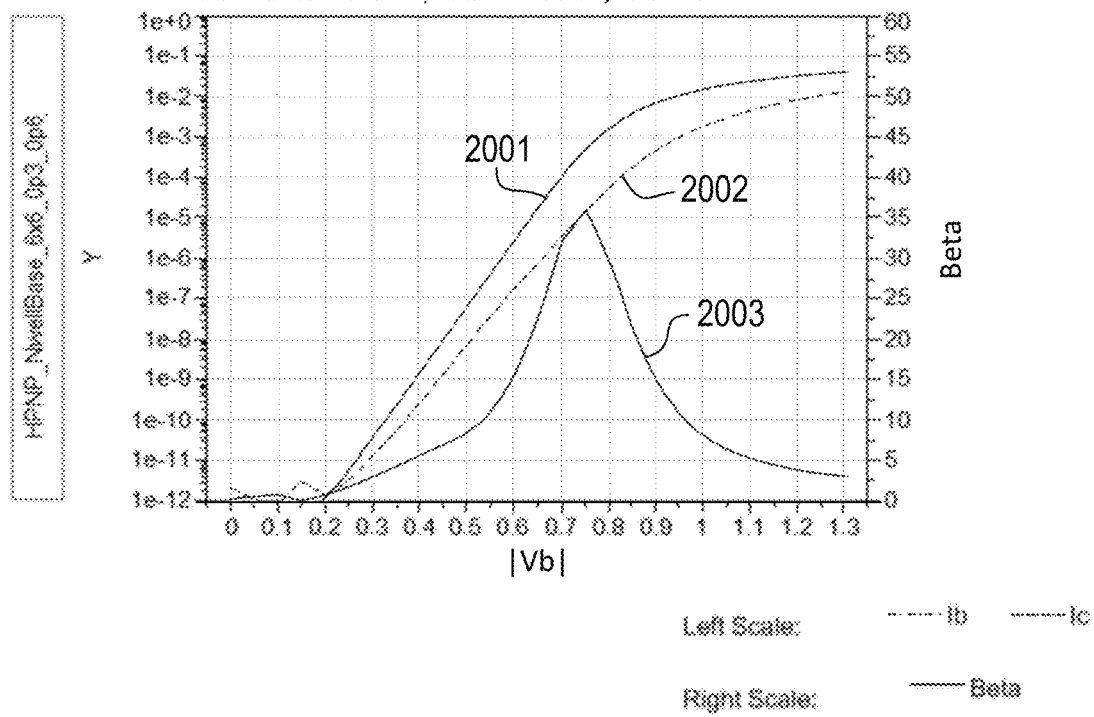
FIGS. 20-25 are simplified graphs showing the performance of example horizontal PNP BJT devices formed with the transistor tile shown in FIGS. 1-4, in accordance with some embodiments.
Figure 21:
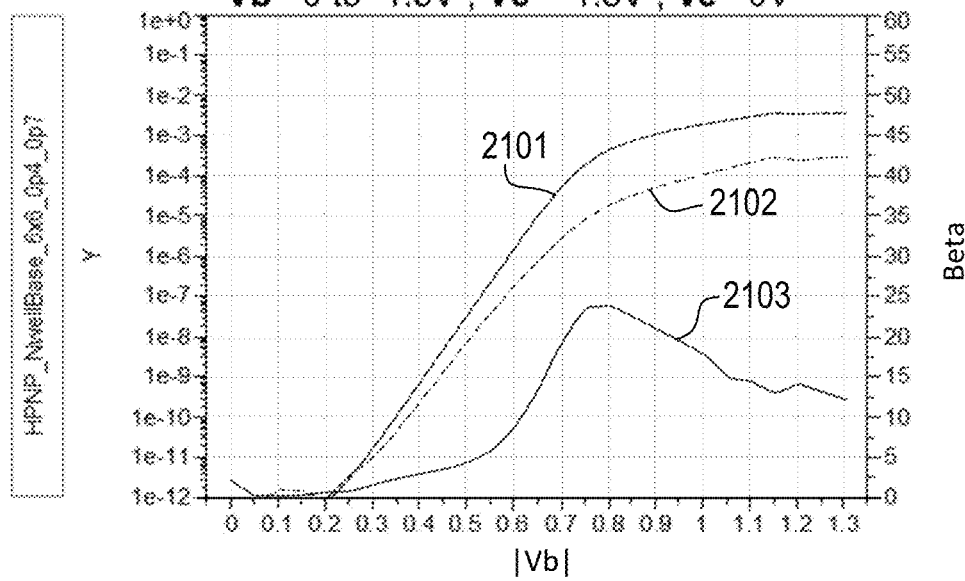
Figure 22:
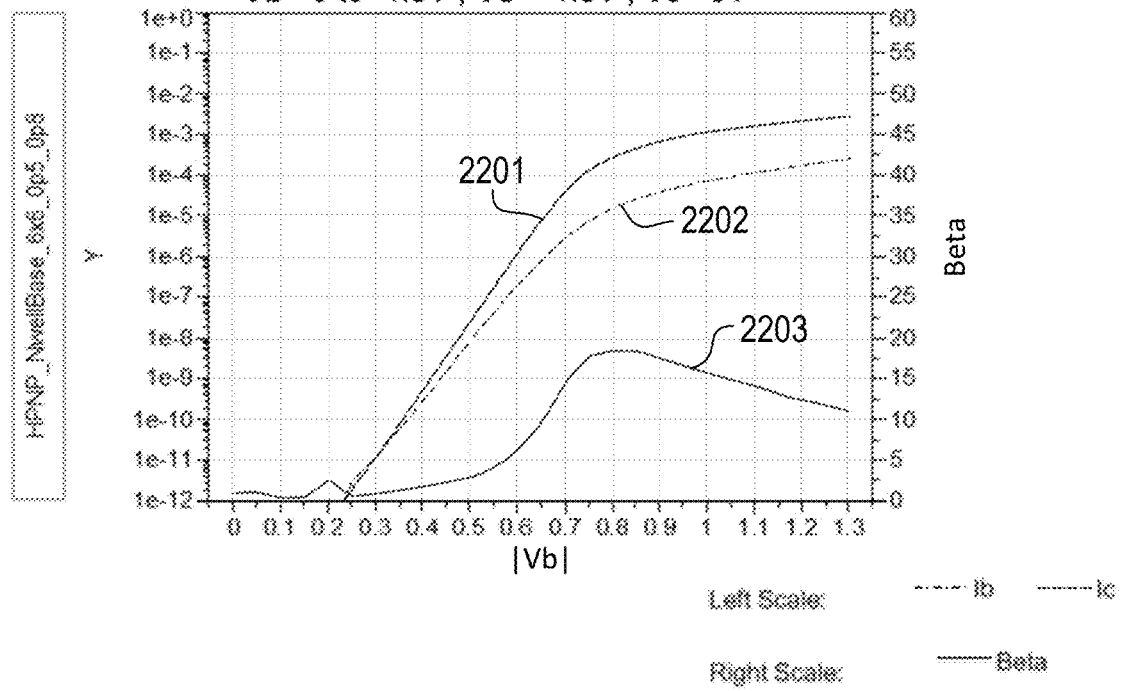
Figure 23:
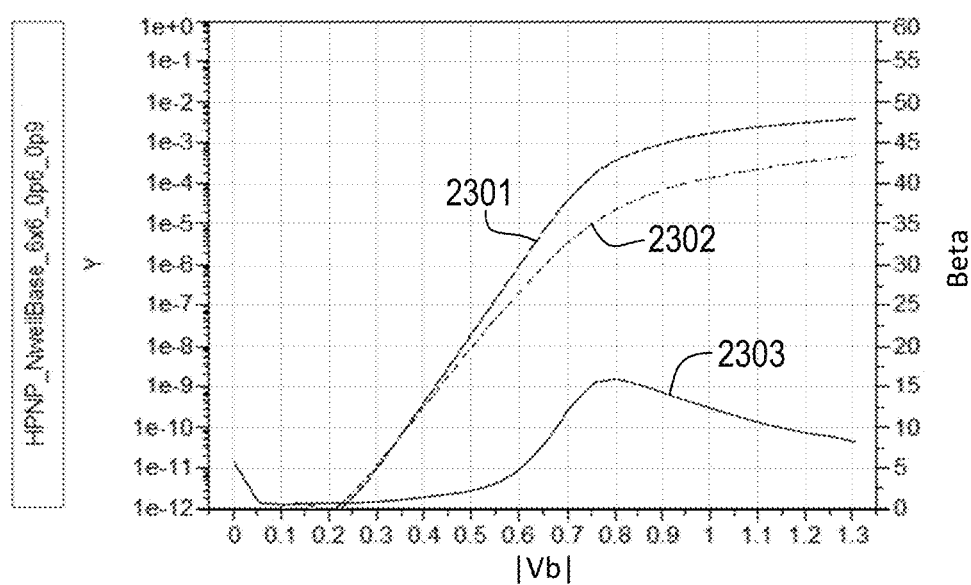
Figure 24:
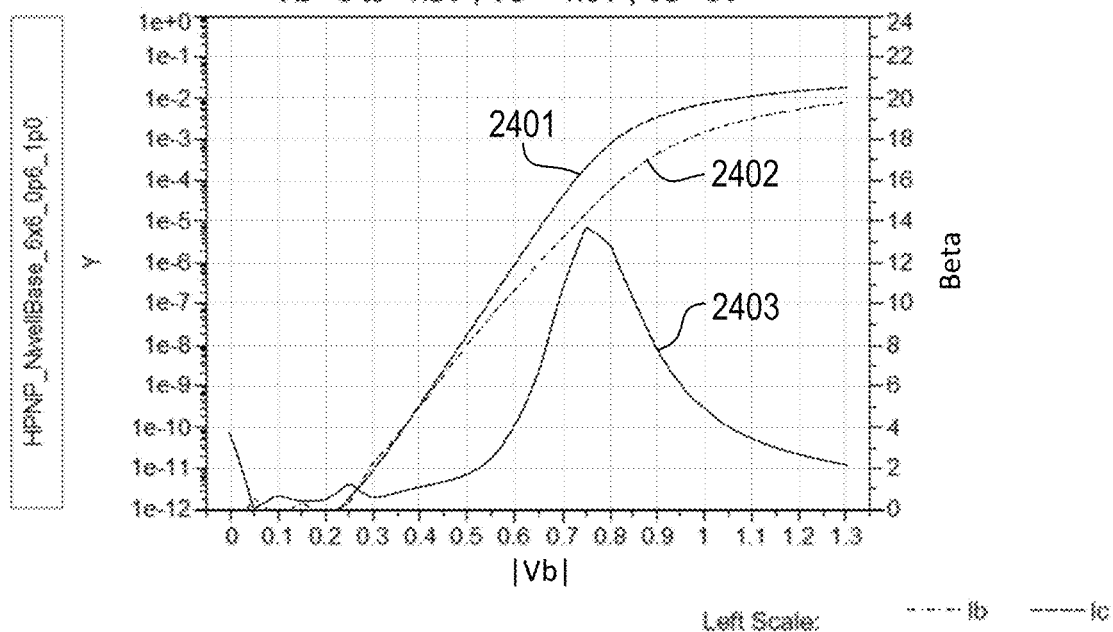
Figure 25:
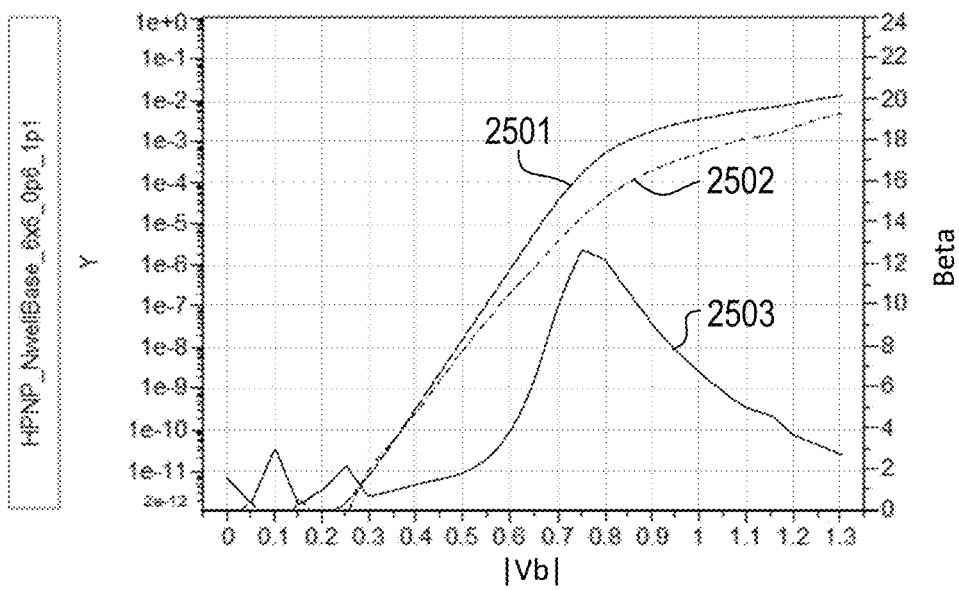

For graphs 2001-2003 in FIG. 20, the example PNP BJT device (designated HPNP_NwellBase_6×6_0p3_0p6) had a 6×6 array or grid of the transistor tiles 100 with a 0.3 um collector enclosure distance (or LDD extension, e.g., arrow 116 in FIGS. 1, 3 and 4) and a 0.6 um collector to base distance (e.g., arrow 114 in FIGS. 1 and 4). For graphs 2101-2103 in FIG. 21, the example PNP BJT device (designated HPNP_NwellBase_6×6_0p4_0p7) had a 6×6 array or grid of the transistor tiles 100 with a 0.4 um collector enclosure distance and a 0.7 um collector to base distance. For graphs 2201-2203 in FIG. 22, the example PNP BJT device (designated HPNP_NwellBase_6×6_0p5-0p8) had a 6×6 array or grid of the transistor tiles 100 with a 0.5 um collector enclosure distance and a 0.8 um collector to base distance. For graphs 2301-2303 in FIG. 23, the example PNP BJT device (designated HPNP_NwellBase_6× 6_0p5_0p9) had a 6×6 array or grid of the transistor tiles 100 with a 0.6 um collector enclosure distance and a 0.9 um collector to base distance. For graphs 2401-2403 in FIG. 24, the example PNP BJT device (designated HPNP_Nwell-Base_6×6_0p6_1p0) had a 6×6 array or grid of the transistor tiles 100 with a 0.6 um collector enclosure distance and a 1.0 um collector to base distance. For graphs 2501-2503 in FIG. 25, the example PNP BJT device (designated HPNP_Nwell-Base_6×6_0p6_1p1) had a 6×6 array or grid of the transistor tiles 100 with a 0.6 um collector enclosure distance and a 1.1 um collector to base distance.

Tables 2601, 2602 and 2700 in FIGS. 26 and 27 summarize the some of the performance characteristics of the example tiled horizontal NPN BJT devices (of FIGS. 10-17), the example tiled horizontal PNP BJT devices (of FIGS. 20-25), and the conventional vertical NPN BJT (of FIGS. 18 and 19). Typically, beta has a value between 20 and 200 for most general-purpose NPN BJT devices (with PNP BJT devices having lower betas), so the tables in FIGS. 26 and 27 show that the example tiled horizontal BJT devices generally operate within normal ranges. The graphs and tables of FIGS. 10-27, thus, validate the functionality of the example tiled horizontal BJT devices with a variety of measurements.

For example, the graphs and tables of FIGS. 10, 12, 14, 16 and 26 characterize the amplification or beta values (i.e., Ic/Ib) at Vc=1.5 volts for the example tiled horizontal NPN BJT devices (HNPN). As shown in the table 2601, the maximum beta at Vc=1.5 volts for the example NPN BJT devices ranged from 177 to 84. The base voltage (Vb) at the maximum beta for each example NPN BJT device was 0.7 volts. The graphs and table of FIGS. 18 and 26 show that the example conventional vertical NPN BJT device (VNPN), by comparison, had a fixed beta of 109 at Vc=1.5 volts and a base voltage (Vb) of 0.7 volts at this beta. The functional parameters of the example tiled horizontal NPN BJT devices, therefore, are comparable to that of the example conventional vertical NPN BJT device, and are also capable of a desirable range (e.g., range of beta) due to the flexibility in design-stage control over device layout, structural feature geometry, and operating parameters of the transistor tiles 100.

Additionally, the graphs and tables of FIGS. 20-26 characterize the amplification or beta values (i.e., Ic/Ib) at Vc=−1.5 volts for the example tiled horizontal PNP BJT devices (HPNP). As shown in the table 2602, the maximum beta at Vc=−1.5 volts for the example PNP BJT devices ranged from 36 to 12.7. The base voltage (Vb) at the maximum beta for each example PNP BJT device was −0.75 to −0.8 volts. Since PNP BJT devices typically have lower betas than do comparable NPN BJT devices, these values demonstrate that the PNP BJT devices are also capable of a desirable range (e.g., range of beta) due to the flexibility in design-stage control over device layout, structural feature geometry, and operating parameters of the transistor tiles 100.

Additionally, the graphs and tables of FIGS. 11, 13, 15, 17 and 27 characterize the amplification or beta values (i.e., Ic/Ib) at Vc=6 volts for the example tiled horizontal NPN BJT devices (HNPN). As shown in the table 2700, the maximum beta at Vc=6 volts for the example NPN BJT devices ranged from 203 to 155. (The collector voltage Vc, thus, characterizes the beta of the example tiled horizontal NPN BJT devices at a higher collector-emitter voltage Vce, since the emitter voltage Ve=0.) The base voltage (Vb) at the maximum beta for each example NPN BJT device was 0.7 volts. The graphs and table of FIGS. 19 and 27 show that the example conventional vertical NPN BJT device (VNPN), by comparison, had a maximum beta of 454 at Vc=6 volts and a base voltage (Vb) of 0.75 volts at the maximum beta. However, the graphs of FIG. 19 demonstrate that the vertical NPN BJT device cannot be used reliably at Vc=6 volts due to non-linear behavior. The functional parameters of the example tiled horizontal NPN BJT devices, on the other hand, are relatively appropriately linear and are capable of a desirable range (e.g., range of beta) due to the flexibility in design-stage control over device layout, structural feature geometry, and operating parameters of the transistor tiles 100.

FIGS. 28-31 provide additional graphs and tables showing the performance of the example horizontal NPN and PNP BJT devices formed with the transistor tile 100, along with the example conventional vertical NPN BJT device for comparison. The additional data available in these graphs and tables further illustrate that the example improved horizontal BJT devices perform or function as well or better than does the conventional vertical BJT device provided for comparison.

Figures 28, 29:
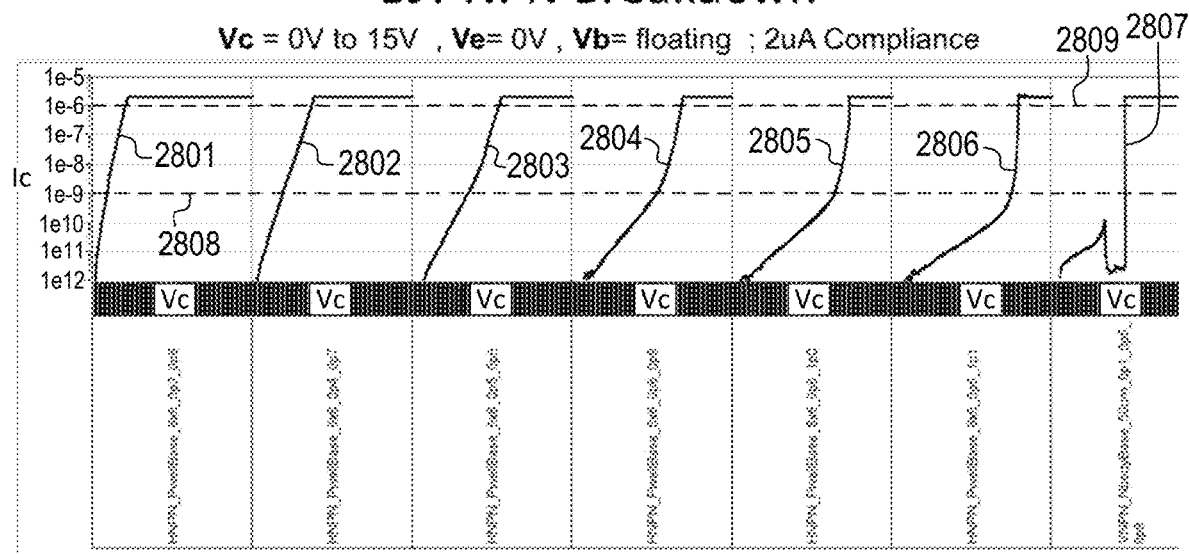
FIGS. 28-31 are additional graphs and tables showing the performance of example horizontal NPN and PNP BJT devices formed with the transistor tile shown in FIGS. 1-4, in accordance with some embodiments, and of an example conventional vertical NPN BJT device.

For example, graphs 2801-2807 in FIG. 28 provide the collector current (Ic) as a function of the collector voltage (Vc) for the example tiled horizontal NPN BJT devices (HNPN) and (for comparison) the example conventional vertical BJT device (VNPN). For these tests, the collector voltage (Vc) varied from 0 to 15 volts, the emitter voltage (Ve) was held at zero/ground, and the base voltage (Vb) was open circuit (i.e., floating), for a 2-uA compliance test. The graphs 2801-2806, thus, characterize the BJT NPN breakdown voltages (i.e., the Vceo rating) for the example tiled horizontal NPN BJT devices (HNPN), and the graph 2807 shows the breakdown voltage for the example conventional vertical BJT device (VNPN). As can be seen in the graphs 2801-2807, the breakdown voltages for the example tiled horizontal NPN BJT devices (HNPN) are within an acceptable range and are comparable to that for the example conventional vertical BJT device (VNPN), thereby further validating the functionality of the example tiled horizontal NPN BJT devices (HNPN).

Additionally, the graphs 2801-2806 in FIG. 28 and table 2900 in FIG. 29 characterize the Vceo voltages for the example tiled horizontal NPN BJT devices (HNPN) and for the example conventional vertical BJT device (VNPN) at a collector current (Ic) of 1 nA (dashed line 2808) and at a collector current (Ic) of 1 uA (dashed line 2809). The Vceo voltages for the example tiled horizontal NPN BJT devices (HNPN) range from 1.2 to 11.2 volts for Ic=1 nA and from 3 to 11.8 volts for Ic=1 uA. By comparison, the Vceo voltage for the example conventional vertical BJT device (VNPN) was about 6.9 volts for both Ic=1 nA and Ic=1 uA, since the Vceo of a vertical NPN BJT device cannot be readily adjusted, i.e., there is generally no control over breakdown voltage for a vertical NPN BJT device. The graphs 2801-2807 in FIG. 28 and the table 2900 in FIG. 29, therefore, further show that the functional parameters of the example tiled horizontal NPN BJT devices (HNPN) are comparable to that of the example conventional vertical NPN BJT device, and are also capable of a desirable range (e.g., range of breakdown voltages) due to the flexibility in design-stage control over device layout, structural feature geometry, and operating parameters of the transistor tiles 100.

Figures 30, 31:
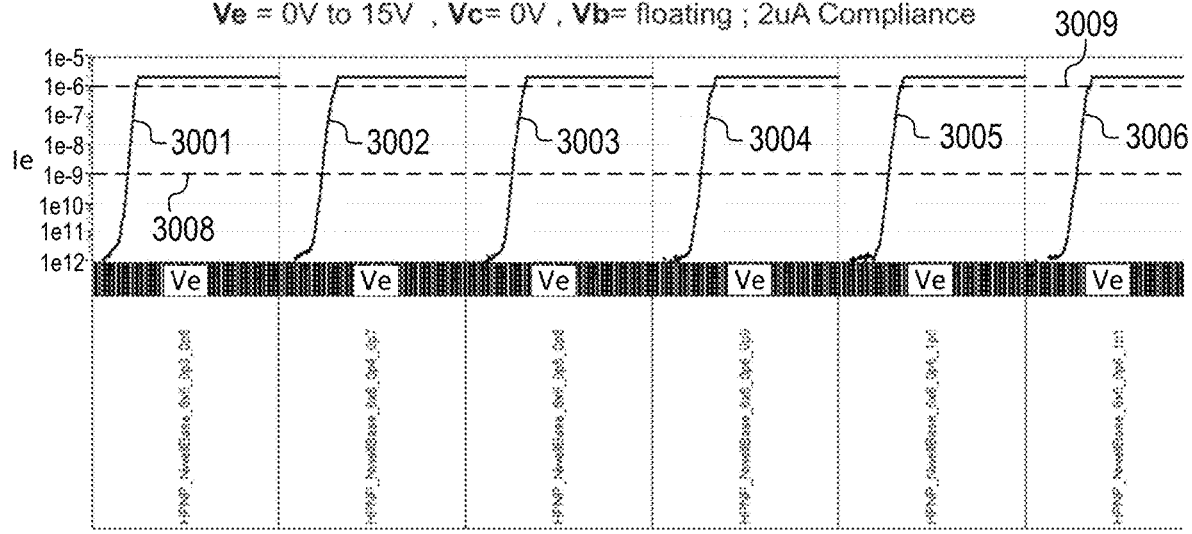
Figure 32:
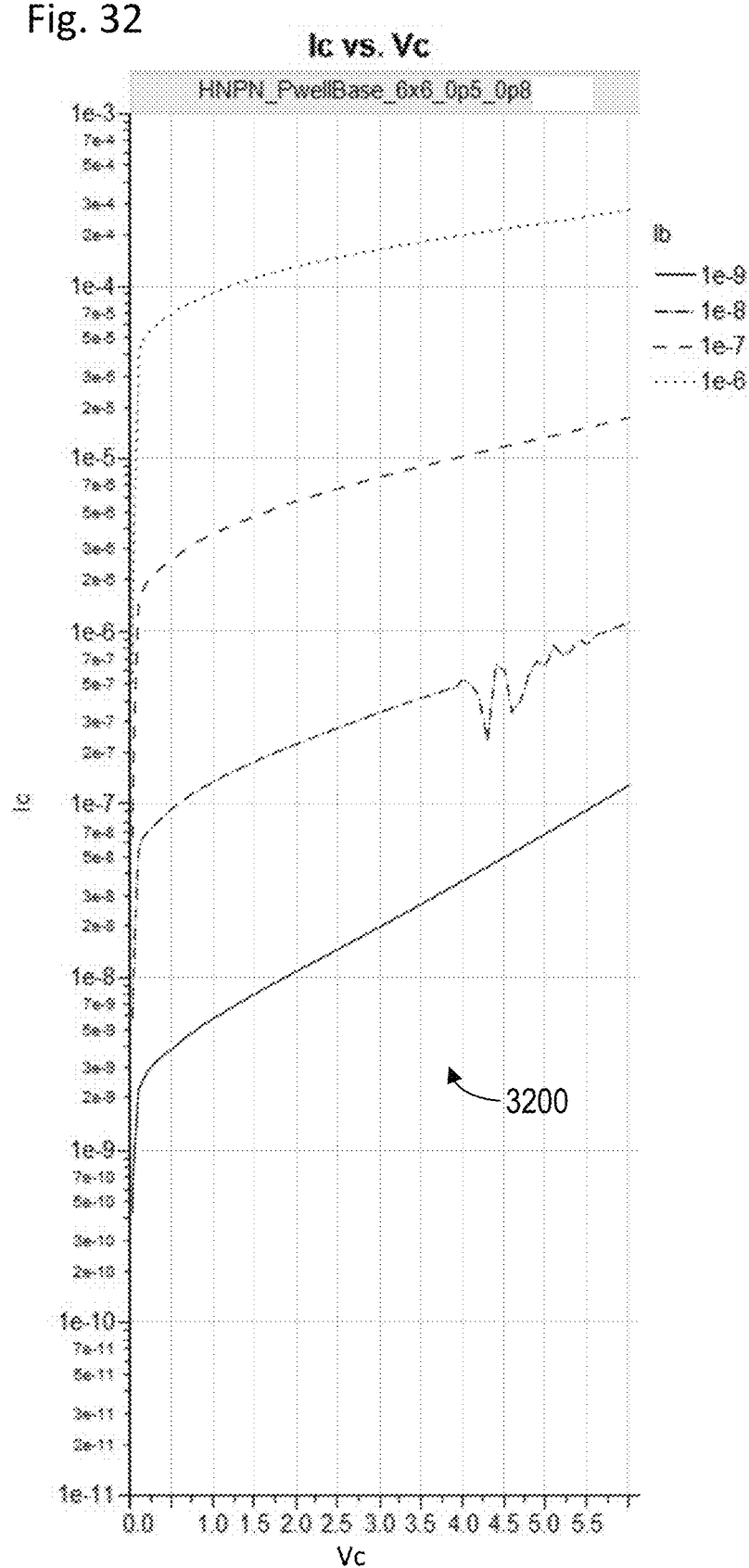
FIGS. 32-35 are additional simplified graphs showing the performance of example horizontal NPN BJT devices formed with the transistor tile shown in FIGS. 1-4, in accordance with some embodiments.
Figure 33:
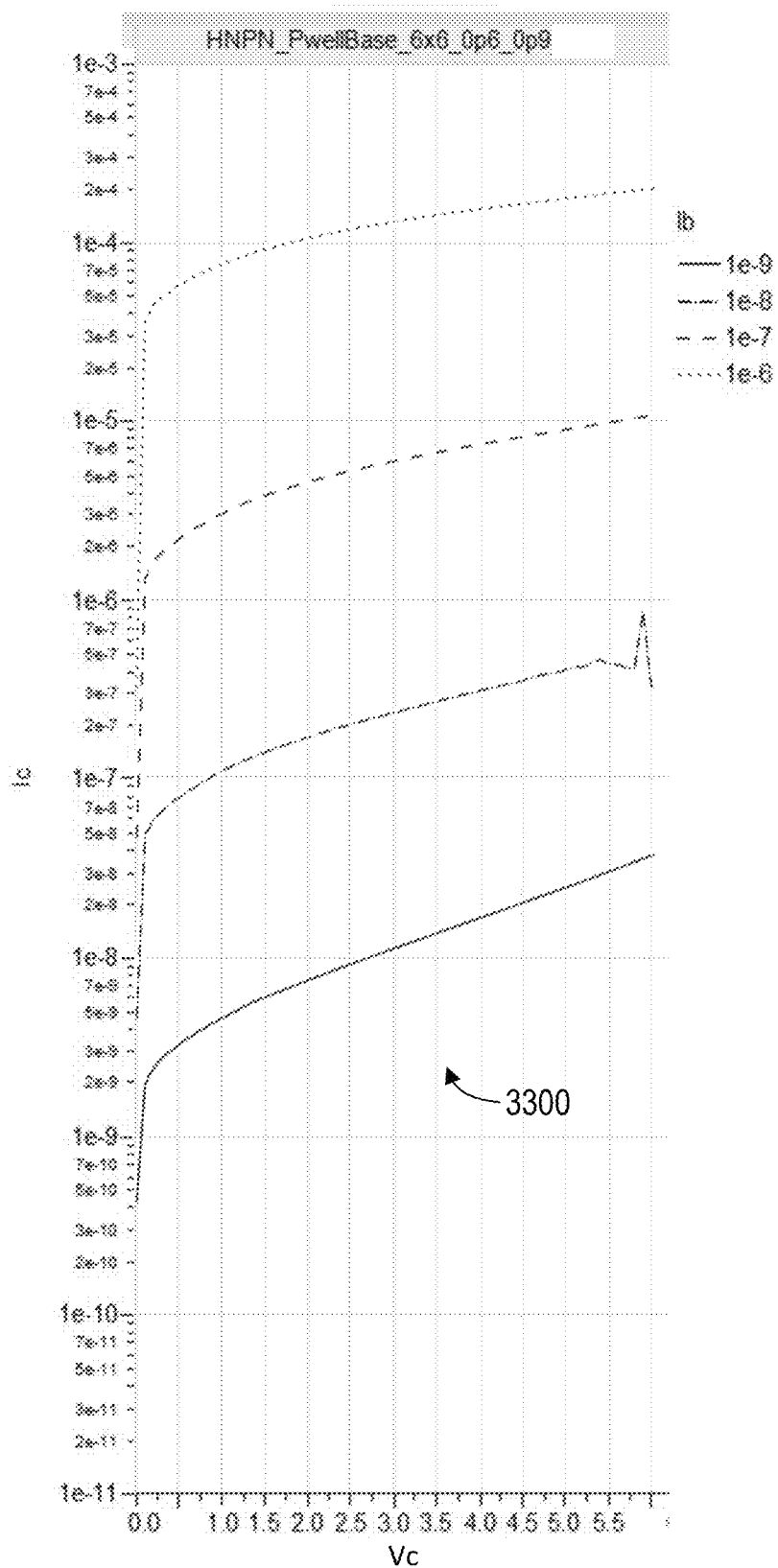
Figure 34:
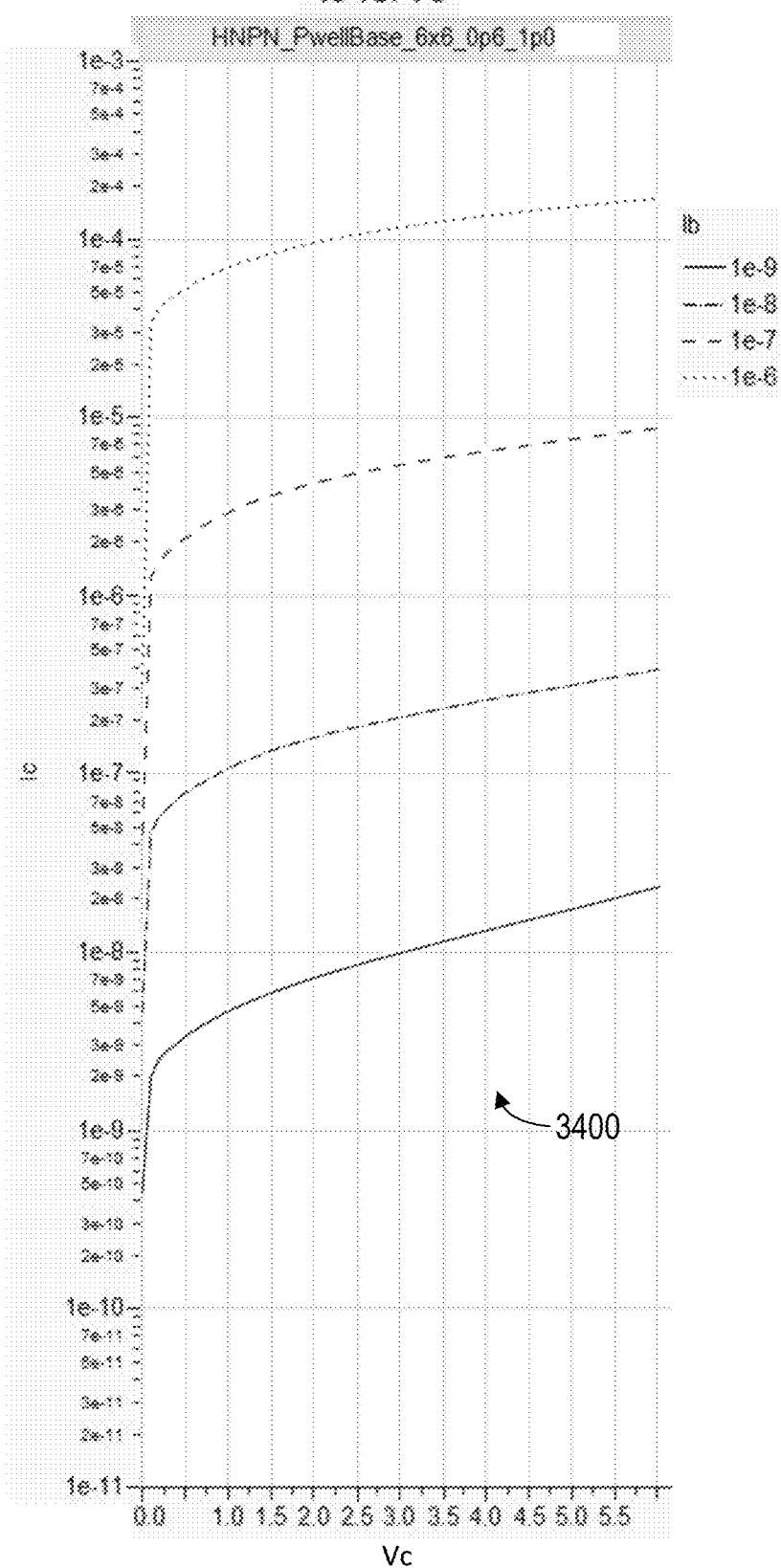
Figure 35:
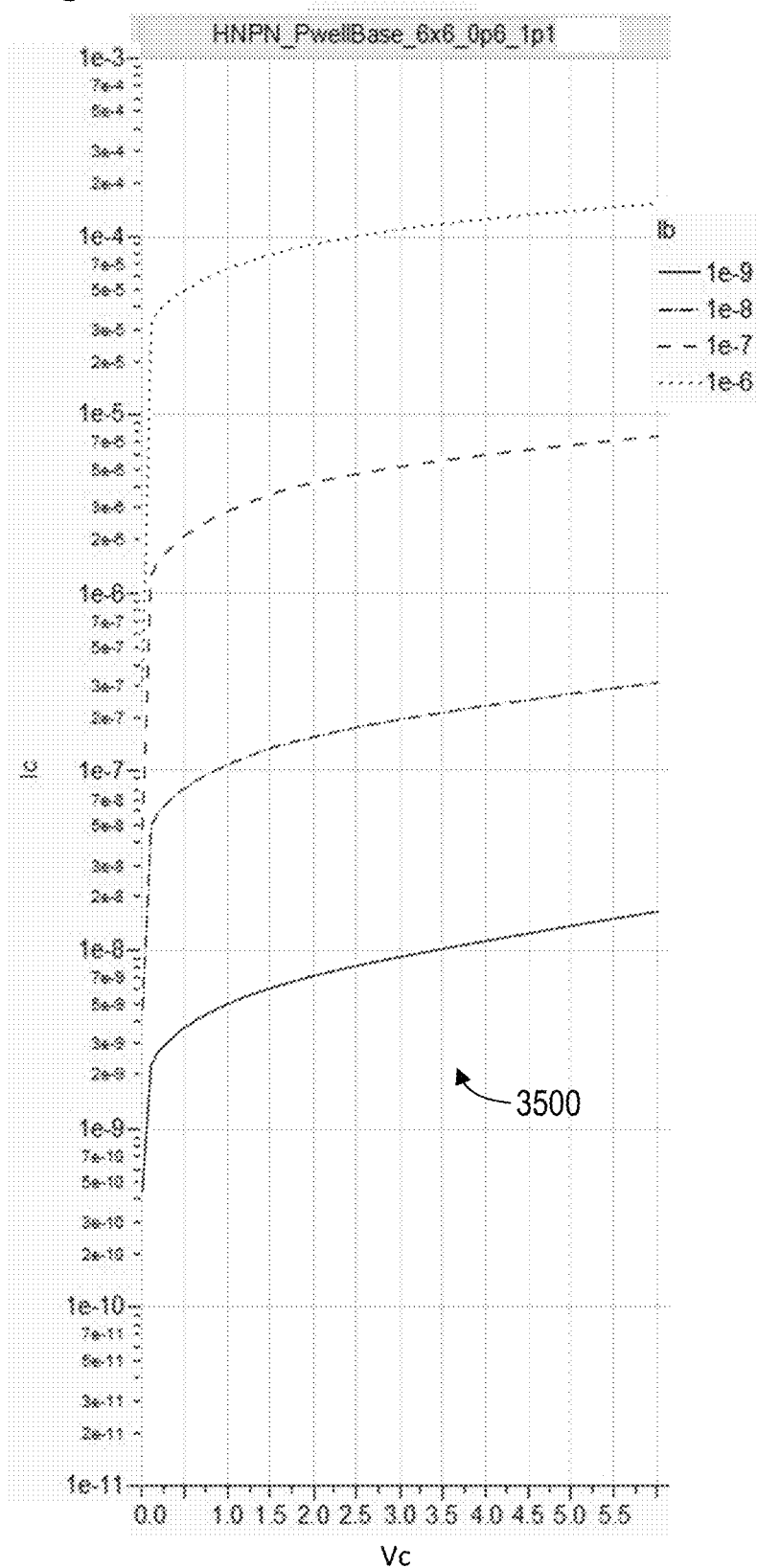

In another example, graphs 3001-3007 in FIG. 30 provide the emitter current (Ie) as a function of the emitter voltage (Ve) for the example tiled horizontal PNP BJT devices (HPNP). For these tests, the emitter voltage (Ve) varied from 0 to 15 volts, the collector voltage (Vc) was held at zero/ground, and the base voltage (Vb) was open circuit (i.e., floating), for a 2-uA compliance test. The graphs 3001-3006, thus, characterize the BJT PNP breakdown voltages (i.e., the Vceo rating) for the example tiled horizontal PNP BJT devices (HPNP). As can be seen in the graphs 3001-3006, the breakdown voltages for the example tiled horizontal PNP BJT devices (HPNP) are within an acceptable range, thereby further validating the functionality of the example tiled horizontal PNP BJT devices (HPNP).

Additionally, the graphs 3001-3006 in FIG. 30 and table 3100 in FIG. 31 characterize the Vceo voltages for the example tiled horizontal PNP BJT devices (HPNP) at an emitter current (Ie) of 1 nA (dashed line 3008) and at an emitter current (Ie) of 1 uA (dashed line 3009). The Vceo voltages for the example tiled horizontal PNP BJT devices (HPNP) range from 2.7 to 4.2 volts for Ie=1 nA and from 3.5 to 5.3 volts for Ie=1 uA. The graphs 3001-3007 in FIG. 30 and the table 3100 in FIG. 31, therefore, further show that the functional parameters of the example tiled horizontal PNP BJT devices (HPNP) are capable of a desirable range (e.g., range of breakdown voltages) due to the flexibility in design-stage control over device layout, structural feature geometry, and operating parameters of the transistor tiles 100. Additionally, a comparison of FIGS. 26, 29 and 31 shows that this flexibility enables an increase in breakdown voltage, but with a decrease in beta.

Figure 36:
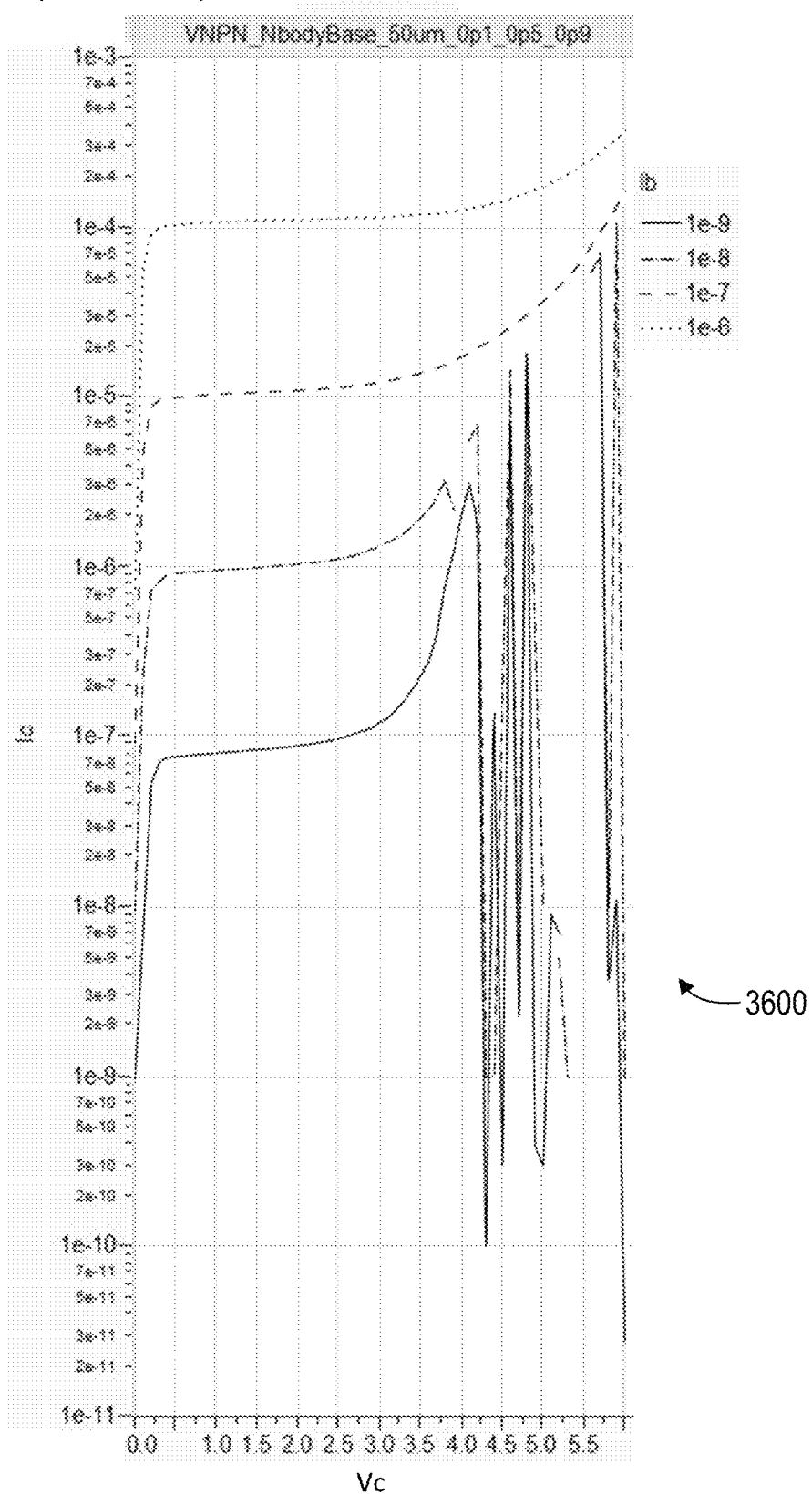
FIG. 36 is simplified graphs showing the performance of an example conventional vertical NPN BJT device.

FIGS. 32-35 provide additional sets of graphs 3200-3500 showing the performance of the example horizontal NPN BJT devices (HNPN) formed with the transistor tile 100. For comparison, FIG. 36 provides a set of graphs 3600 showing the performance of the example conventional vertical NPN BJT (VNPN). The additional data available in these graphs further illustrate that the example improved horizontal NPN BJT devices perform or function as well or better than does the conventional vertical NPN BJT device provided for comparison.

The graphs in FIGS. 32-35 provide a set of measurements for a family of Ic vs Vc curves for several base currents Ib for four of the previously described example horizontal NPN BJT devices (HNPN), and the graph in FIG. 36 provides the same set of measurements for the example conventional vertical NPN BJT (VNPN). Each set of graphs 3200-3600 provides the Ic vs Vc curve for Ib=1 nA (1e-9), 10 nA (1e-8), 100 nA (1e-7), and 1 uA (1e-6). For each graph, the sweep of the collector voltage Vc is from zero/ground to 6 volts. Additionally, the emitter voltage Ve is held at zero volts (i.e., ground), so Vc=Vce.

The sets of graphs 3200-3500 show that the example horizontal NPN BJT devices (HNPN) exhibit desirable relatively linear characteristics throughout most of the sweep of the collector voltage Vc from zero/ground to 6 volts. On the other hand, the set of graphs 3600 show that the example conventional vertical NPN BJT (VNPN) cannot be reliably used at Vceo>3V due to non-linear behavior. The sets of graphs 3200-3500 in FIGS. 32-35, therefore, further show that the functional parameters of the example tiled horizontal NPN BJT devices (HNPN) are capable of a desirable range (e.g., ranges of collector current Ic and collector voltage Vc) due to the flexibility in design-stage control over device layout, structural feature geometry, and operating parameters of the transistor tiles 100.

FIG. 37 shows a simplified flowchart for a process 3700 for forming the BJT devices with the transistor tiles 100, in accordance with one or more example embodiments. The particular steps, combination of steps, and order of the steps are provided for illustrative purposes only. Other processes with different steps, combinations of steps, or orders of steps can also be used to achieve the same or similar result. Features or functions described for one of the steps may be performed in a different step in some embodiments. Furthermore, additional steps not explicitly shown or described may be performed before or after or as a sub-portion of the steps shown.

Upon starting, a semiconductor wafer is provided (at 3701). In some embodiments, the semiconductor wafer is already a fully formed SOI wafer at this point. In some embodiments, the semiconductor wafer is a bulk semiconductor wafer, i.e., without a buried oxide of an SOI wafer. In some embodiments, providing the semiconductor wafer at 3701 includes forming a buried oxide layer (e.g., for the BOX 201 in FIGS. 2-4) on a substrate (e.g., the underlying substrate 202 in FIGS. 2-4) and forming a semiconductor layer (e.g., the N-minus or P-minus region 109 in FIGS. 1-4) on the buried oxide layer (e.g., by epitaxial growth or layer transfer techniques), thereby forming an SOI wafer. In some embodiments, the semiconductor layer is either an N-minus or P-minus Epi layer, depending on whether the transistor tiles 100 form an NPN or PNP BJT device.

Some of the subsequent structure formation steps are performed, for example, by patterning a photoresist over the semiconductor layer and implanting dopants of the appropriate N and P conductivity to form the active region of the transistor tile 100. Additionally, these formation steps can be performed in conjunction with forming other structures or components of the overall electronic circuit of which the resulting horizontal or lateral NPN or PNP BJT device is a part.

At 3702, to begin forming the active region, a P-well or N-well is formed as a base region (e.g., the P-well base region 106 in FIGS. 1-4) in the semiconductor layer. For example, the P-well base region 106 is formed in the N-minus or P-minus region 109 between the first and second collector regions 107 and 108.

At 3703, regions of the field oxide 203 are formed on the active region of the transistor tile 100. Additionally, areas of the field oxide 203 are removed from portions of the base connector regions 101 and 102, the emitter regions 103, and the collector connector regions 104 and 105, so that subsequent processing steps can implant or deposit dopants or materials through these openings in the field oxide 203.

At 3704, collector regions (e.g., the collector regions 107 and 108 in FIGS. 1, 3 and 4) are formed within the semiconductor layer. In other words, appropriate dopants are implanted into the semiconductor layer to form the collector regions (e.g., NLDD or PLDD regions formed as the collector regions) within the N-minus or P-minus Epi layer.

At 3705, collector N+ or P+ regions are formed in the collector regions, and emitter N+ or P+ regions are formed in the P-well or N-well base regions. The first and second collector regions 107 and 108 and the first and second collector connector regions 104 and 105 (FIGS. 1, 3 and 4) are thus formed longitudinally spanning first and second sides (i.e., lateral portions) of the transistor tile 100 by forming the collector regions and the collector N+ or P+ regions; and the collector regions and the collector N+ or P+ regions are thus formed in the first and second collector regions 107 and 108. Additionally, the emitter region 103 is thus formed laterally between the first and second collector connector regions 104 and 105 or the first and second collector regions 107 and 108, between the first and second base connector regions 101 and 102, and centered on the longitudinally extending, laterally located midline of the transistor tile 100; and the emitter N+ or P+ region is thus formed in the emitter region 103.

At 3706, the base P+ or N+ regions are formed in the P-well or N-well base regions. The base connector regions 101 and 102 are thus formed laterally between the first and second collector connector regions 104 and 105 or the first and second collector regions 107 and 108 and centered on the longitudinally extending, laterally located midline of the transistor tile 100; and the base P+ or N+ regions are thus formed in the base connector regions 101 and 102.

At 3707, electrically conductive material (e.g., metals, etc.) can be deposited to form the base contacts 110, the emitter contacts 111, and the collector contacts 112 on the base connector regions 101 and 102, the emitter regions 103, and the collector connector regions 104 and 105, respectively. At 3708, a series of alternating insulator layers (with electrically conductive vias therethrough) and electrically conductive interconnect layers are formed, thereby electrically connecting the transistor tiles 100 through the contacts 110-112 to the other structures or components of the overall electronic circuit of which the resulting horizontal or lateral NPN or PNP BJT device is a part. The overall electronic circuit is further processed into an integrated circuit package.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A transistor tile formed within a horizontal length, a horizontal width, and a vertical thickness, the transistor tile comprising:

a first NLDD region formed as a first collector region located within a first portion of the transistor tile;

a second NLDD region formed as a second collector region located within a second portion of the transistor tile;

a P-well formed as a base region located within a central portion of the transistor tile between the first and second NLDD regions, wherein the central portion is horizontally between the first and second portions, and a direction of a flow of a base-collector current is horizontal between the first and second collector regions and the base region; and an emitter N+ region formed as an emitter region located within the central portion of the transistor tile and in the P-well, wherein a direction of a flow of a collector-emitter current is horizontal between the first and second collector regions and the emitter region, and a direction of a flow of a base-emitter current is horizontal through the base region;

wherein the direction of the flow of the base-emitter current is perpendicular to the direction of the flows of the base-collector current and the collector-emitter current.

2. The transistor tile of claim 1, wherein:

the transistor tile has a longitudinal dimension and a lateral dimension in a horizontal plane;

the first and second portions and the central portion extend longitudinally within the transistor tile:

the first and second portions are located laterally from the central portion; and the first and second collector regions extend longitudinally within the first and second portions, respectively.

3. The transistor tile of claim 1, further comprising:

first and second base connector regions located within the central portion;

wherein:

the emitter region is located between the first base connector region and the second base connector region; and the direction of the flow of the base-emitter current is horizontal between the first and second base connector regions and the emitter region.

4. A BJT transistor comprising a plurality of the transistor tile of claim 1, wherein:

the first collector region of a first one of the plurality of the transistor tile and the first collector region of a second one of the plurality of the transistor tile both form a first common collector region of the BJT transistor;

the second collector region of the first one of the plurality of the transistor tile and the second collector region of the second one of the plurality of the transistor tile both form a second common collector region of the BJT transistor; and the base region of the first one of the plurality of the transistor tile and the base region of the second one of the plurality of the transistor tile both form a common base region of the BJT transistor.

5. A BJT transistor comprising a plurality of the transistor tile of claim 1, wherein:
the second collector region of a first one of the plurality of the transistor tile is shared as the first collector region of a second one of the plurality of the transistor tile of the BJT transistor.

6. The transistor tile of claim 1, wherein the transistor tile is formed on a semiconductor-on-insulator wafer.

7. A transistor tile comprising:
a first NLDD region formed as a first collector region longitudinally spanning a first side of the transistor tile;
a second NLDD region formed as a second collector region longitudinally spanning a second side of the transistor tile;
a P-well formed as a base region located laterally between the first and second NLDD regions; and
an emitter N+ region formed as an emitter region located laterally between the first and second collector regions and in the P-well;
wherein the base region and emitter region are both centered on a longitudinally extending, laterally located midline of the transistor tile.

8. The transistor tile of claim 7, further comprising:
first and second base connector regions located laterally between the first and second collector regions;
wherein:
the first and second base connector regions are centered on the longitudinally extending, laterally located midline of the transistor tile; and
the emitter region is located longitudinally between the first and second base connector regions.

9. A BJT transistor comprising a plurality of the transistor tile of claim 8, wherein:
the first collector region of a first one of the plurality of the transistor tile and the first collector region of a second one of the plurality of the transistor tile both form a first common collector region of the BJT transistor;
the second collector region of the first one of the plurality of the transistor tile and the second collector region of the second one of the plurality of the transistor tile both form a second common collector region of the BJT transistor; and
the second base connector region of the first one of the plurality of the transistor tile is shared as the first base connector region of the second one of the plurality of the transistor tile.

10. A BJT transistor comprising a plurality of the transistor tile of claim 8, wherein:
the second collector region of a first one of the plurality of the transistor tile is shared as the first collector region of a second one of the plurality of the transistor tile of the BJT transistor.

11. The transistor tile of claim 7, further comprising:
a buried oxide on a substrate;
a semiconductor layer on the buried oxide, the first NLDD region, the second NLDD region, and the P-well being formed in the semiconductor layer.

12. The transistor tile of claim 7, further comprising:
a base P+ region formed in the P-well;
wherein a ratio of a horizontal area of the emitter N+ region to a horizontal area of the base P+ region controls a beta of the transistor tile.

13. The transistor tile of claim 7, further comprising:
a base P+ region formed in the P-well;
wherein:
a horizontal distance between the base P+ region and the emitter N+ region controls a base-emitter maximum rating voltage of the transistor tile;
a horizontal distance between the base P+ region and a nearest edge of the first or second NLDD region controls a collector-base maximum rating voltage of the transistor tile;
a horizontal distance between the emitter N+ region and another nearest edge of the first or second NLDD region controls a collector-emitter maximum rating voltage of the transistor tile; and
a horizontal distance between the first or second collector N+ region and an outer edge of the first or second NLDD region controls a ratio of the collector-base maximum rating voltage to the collector-emitter maximum rating voltage of the transistor tile.

14. A transistor tile comprising:
a first PLDD region formed as a first collector region longitudinally spanning a first side of the transistor tile;
a second PLDD region formed as a second collector region longitudinally spanning a second side of the transistor tile;
an N-well formed as a base region located laterally between the first and second PLDD regions; and
an emitter P+ region formed as an emitter region located laterally between the first and second collector regions and in the N-well;
wherein the base region and emitter region are both centered on a longitudinally extending, laterally located midline of the transistor tile.

15. The transistor tile of claim 14, further comprising:
first and second base connector regions located laterally between the first and second collector regions;
wherein:
the first and second base connector regions are centered on the longitudinally extending, laterally located midline of the transistor tile; and
the emitter region is located longitudinally between the first and second base connector regions.

16. A BJT transistor comprising a plurality of the transistor tile of claim 15, wherein:
the first collector region of a first one of the plurality of the transistor tile and the first collector region of a second one of the plurality of the transistor tile both form a first common collector region of the BJT transistor;
the second collector region of the first one of the plurality of the transistor tile and the second collector region of the second one of the plurality of the transistor tile both form a second common collector region of the BJT transistor; and
the second base connector region of the first one of the plurality of the transistor tile is shared as the first base connector region of the second one of the plurality of the transistor tile.

17. A BJT transistor comprising a plurality of the transistor tile of claim 15, wherein:
the second collector region of a first one of the plurality of the transistor tile is shared as the first collector region of a second one of the plurality of the transistor tile of the BJT transistor.

18. The transistor tile of claim 14, further comprising:
a buried oxide on a substrate; and
a semiconductor layer on the buried oxide, the first PLDD region, the second PLDD region, and the N-well being formed in the semiconductor layer.

19. The transistor tile of claim 14, further comprising:
a base N+ region formed in the N-well;
wherein a ratio of a horizontal area of the emitter P+ region to a horizontal area of the base N+ region controls a beta of the transistor tile.

20. The transistor tile of claim 14, further comprising:
a base N+ region formed in the N-well;
wherein:
a horizontal distance between the base N+ region and the emitter P+ region controls a base-emitter maximum rating voltage of the transistor tile;
a horizontal distance between the base N+ region and a nearest edge of the first or second PLDD region controls a collector-base maximum rating voltage of the transistor tile;
a horizontal distance between the emitter P+ region and another nearest edge of the first or second PLDD region controls a collector-emitter maximum rating voltage of the transistor tile; and
a horizontal distance between the first or second collector P+ region and an outer edge of the first or second PLDD region controls a ratio of the collector-base maximum rating voltage to the collector-emitter maximum rating voltage of the transistor tile.

* * * * *